United States Patent
Omatsu et al.

(10) Patent No.: US 9,005,512 B2
(45) Date of Patent: Apr. 14, 2015

(54) METHOD FOR FORMING PATTERNS AND METHOD FOR PRODUCING PATTERNED SUBSTRATES

(71) Applicant: FUJIFILM Corporation, Tokyo (JP)

(72) Inventors: Tadashi Omatsu, Shizuoka-ken (JP); Satoshi Wakamatsu, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 417 days.

(21) Appl. No.: 13/647,849

(22) Filed: Oct. 9, 2012

(65) Prior Publication Data

US 2013/0032971 A1 Feb. 7, 2013

Related U.S. Application Data

(63) Continuation-in-part of application No. PCT/JP2011/002087, filed on Apr. 8, 2011.

(30) Foreign Application Priority Data

Apr. 9, 2010 (JP) .................. 2010-090080

(51) Int. Cl.
*H01L 21/302* (2006.01)
*C08F 2/46* (2006.01)
*B82Y 10/00* (2011.01)
*B82Y 40/00* (2011.01)
(Continued)

(52) U.S. Cl.
CPC . *C08F 2/46* (2013.01); *B82Y 10/00* (2013.01); *B82Y 40/00* (2013.01); *G03F 7/0002* (2013.01); *C08F 2/54* (2013.01); *H01L 21/3086* (2013.01)

(58) Field of Classification Search
CPC .......................................... C08F 2/46
USPC ....................... 264/496; 428/195.1
See application file for complete search history.

(56) References Cited

U.S. PATENT DOCUMENTS 6,387,787 B1 * 5/2002 Mancini et al. ............. 438/586
7,163,888 B2 * 1/2007 Gehoski et al. ............. 438/627
(Continued)

FOREIGN PATENT DOCUMENTS

JP 11-100378 4/1999
JP 2926262 7/1999
(Continued)

OTHER PUBLICATIONS

Leveder et al., "Optimization of demolding temperature for throughput improvement of nanoimprint lithography", Microelectronic Engineering 84 (2007) 953-957, Jan. 30, 2007.*
(Continued)

*Primary Examiner* — Galen Hauth
(74) *Attorney, Agent, or Firm* — Young & Thompson

(57) ABSTRACT

A resist layer constituted by a resist composition (which may include unavoidable impurities) including a polymerizable compound that includes polyfunctional monomers that become polymers having three dimensional structures by cross linking when polymerized and a polymerization initiating agent which is activated by one of light and an electron beam is formed on a substrate. A surface of a mold having a predetermined pattern of protrusions and recesses is pressed against the resist layer. Light is irradiated onto the resist layer to cure the resist layer. The mold is separated from the resist layer under conditions that the temperature of the resist layer is 40° C. or greater.

14 Claims, 2 Drawing Sheets

(51) Int. Cl.
*G03F 7/00* (2006.01)
*C08F 2/54* (2006.01)
*H01L 21/308* (2006.01)

(56) References Cited

U.S. PATENT DOCUMENTS

| | | | |
|---|---|---|---|
| 7,883,764 | B2 | 2/2011 | Murao |
| 8,025,833 | B2 | 9/2011 | Kodama et al. |
| 2006/0036051 | A1 | 2/2006 | Xu et al. |
| 2009/0136654 | A1 | 5/2009 | Xu et al. |
| 2011/0003909 | A1 | 1/2011 | Fujita et al. |

FOREIGN PATENT DOCUMENTS

| | | |
|---|---|---|
| JP | 2006-080447 | 3/2006 |
| JP | 2006-114882 | 4/2006 |
| JP | 2008-095037 | 4/2008 |
| JP | 2008-105414 | 5/2008 |
| JP | 2009-110997 | 5/2009 |
| JP | 2009-218550 | 9/2009 |
| JP | 2010-006870 | 1/2010 |
| JP | 2010-017936 | 1/2010 |
| WO | WO 2009/110496 | 9/2009 |
| WO | WO 2009/110536 | 9/2009 |

OTHER PUBLICATIONS

"Experimental Chemistry Lessons, 20 Organic Syntheses II", Maruzen K.K. Press pp. 213-224, 2002.

A. Hasfner, Ed., "The chemistry of Heterocyclic compounds—Small Ring Heterocycles Part 3, Oxiranes", John Wiley and Sons, An Interscience Publication, New York, pp. 15-57, 1985.

N. Yoshimura, "Typical synthetic reaction of epoxy resin. 1" Adhesives, vol. 29, No. 12, pp. 32-38, 1985.

N. Yoshimura, "Typical synthetic reaction of epoxy resin. 2" Adhesives, vol. 30, No. 5, pp. 43-46, 1986.

N. Yoshimura, "Typical synthetic reaction of epoxy resin. 3" Adhesives, vol. 30, No. 7, pp. 42-46, 1986.

S.C. Lapin, "Vinyl ether functionalized urethane oligomers: an alternative to acrylate based systems", Polymers Paint Colour Journal, vol. 179, No. 4237, pp. 321-328, 1988.

* cited by examiner

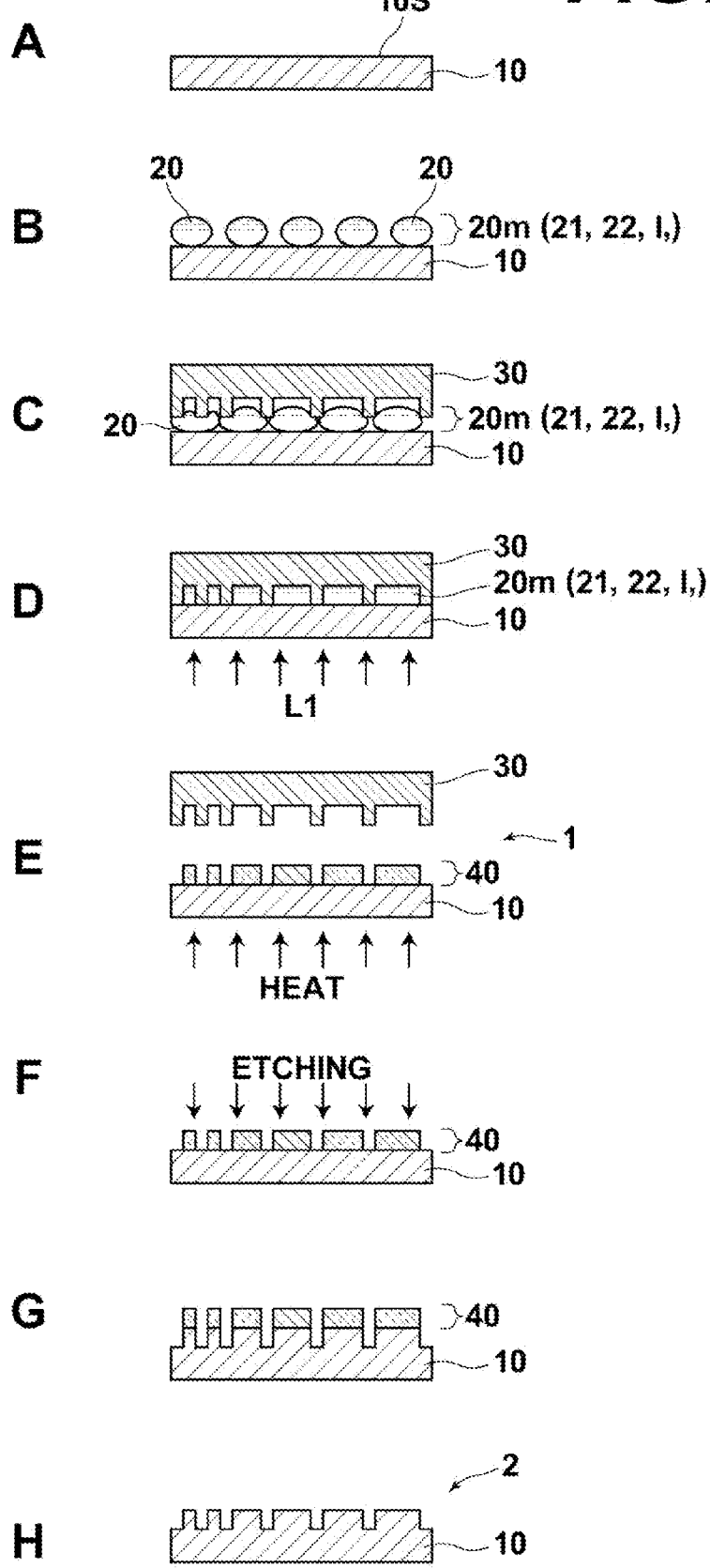

METHOD FOR FORMING PATTERNS AND METHOD FOR PRODUCING PATTERNED SUBSTRATES

TECHNICAL FIELD

The present invention is related to a method for forming patterns employing the imprinting method, and a method for producing patterned substrates employing the method for forming patterns.

BACKGROUND ART

The imprinting method is a method for forming patterns corresponding to a pattern of a mold on a substrate. The patterns are formed by pressing the mold, on which a pattern has been formed in the shapes of protrusions and recesses in advance, against a resist resin layer of a processing target substrate. The imprinting method is gathering attention in the fields of semiconductor elements and patterned media such as hard disks that require refinement, from the viewpoints of formability of fine patterns, productivity, and cost.

Representative techniques of the imprinting method include a thermal imprinting method, a thermal embossing method, and an optical imprinting method. In the thermal imprinting method, a thermoplastic resin is employed as resist, a mold is pressed against the resist at high pressure in a temperature range in the vicinity of the Tg of the resist, then the mold is separated from the resist after the temperature is lowered to Tg or less to solidify the shapes of a pattern. The thermal embossing method also employs a thermoplastic resin as resist. In the thermal embossing method, a mold is pressed against the resist at high pressure in a temperature range lower than Tg, to form a pattern. In the optical imprinting method, a resist which is liquid and has fluidity at room temperature is cured by photocuring in a state in which a mold is pressed against the resist, to transfer a pattern.

From among the above techniques, there are expectations for optical imprinting method as a next generating fine processing production technique which is capable of forming highly precise patterns using molds having desired patterns thereon easily and at low cost. There are expectations for the optical imprinting method as a technique which is a process that can be executed at room temperature as opposed to the thermal methods and does not require high pressure, while also capable of refinement and reduction of residual film thickness corresponding to the thickness between the recesses of patterns and substrates.

Favorable mold release properties, thinness and in plane uniformity of resist layers between the recesses of patterns and substrates (residual film thickness), and etching resistance of resist material during following lithography processes are required in optical imprinting in order to perform patterning with high quality rectangular pattern shaping properties and roughness.

Patent Documents 1 and 2 disclose imprinting resist having fluorine resin as a main component. Favorable mold release properties are secured by using fluorine resin as a main component of the resist.

Patent Document 3 discloses a technique that improves mold release properties by causing a fluorine containing layer to be present on the surface of a resist layer. Patent Document 4 discloses a technique that improves the wetting properties of a resist material with respect to a mold and mold release properties, by employing a resist composition that includes a surfactant as expelled liquid, arranging resist in a specific pattern of discrete droplets, and causing a large amount of a surfactant to adhere to locations on the surface of the mold corresponding to the droplet arrangement pattern.

PRIOR ART DOCUMENTS

Patent Documents

[Patent Document 1]
Japanese Unexamined Patent Publication No. 2009-110997
[Patent Document 2]
U.S. Patent Application Publication No. 2006/0036051
[Patent Document 3]
Japanese Unexamined Patent Publication No. 2006-080447
[Patent Document 4]
U.S. Patent Application Publication No. 2009/0136654

However, the fluorination ratio of the resist material is high in the methods disclosed in Patent Documents 1 and 2, and therefore, sufficient etching resistance during steps following imprinting cannot be obtained when forming nano order pattern formation.

In addition, pattern formation precision deteriorates due to accumulation of surfactants on the surfaces of molds in the techniques disclosed in Patent Documents 3 and 4. Therefore, it is difficult to apply these techniques to patterns having sizes of several tens of nanometers or less.

The present invention has been developed in view of the foregoing circumstances. It is an object of the present invention to provide a method for forming patterns capable of highly precise patterning even in nano order pattern formation, which is superior in productivity and etching resistance.

It is another object of the present invention to produce patterned substrates by processing a substrate, on which a mask has been formed by the method for forming patterns, by a lithography method, to produce highly precisely patterned substrates.

DISCLOSURE OF THE INVENTION

A method for forming patterns of the present invention comprises the steps of:

forming a resist layer constituted by a resist composition (which may include unavoidable impurities) including a polymerizable compound that includes polyfunctional monomers that become polymers having three dimensional structures by cross linking when polymerized and a polymerization initiating agent which is activated by one of light and an electron beam on a substrate;

pressing a surface of a mold having a predetermined pattern of protrusions and recesses against the resist layer:

irradiating the light or the electron beam onto the resist layer to cure the resist layer; and separating the mold from the resist layer under conditions that the temperature of the resist layer is 40° C. or greater.

Here, the term "polyfunctional monomers" refer to monomers having a plurality of ethylene unsaturated double bonds. It is preferable for the polyfunctional monomers to have at least one bivalent or trivalent aromatic ring group.

In the method for forming patterns of the present invention, the temperature of the resist layer can be made to be 40° C. or greater, by separating the mold from the resist layer while causing the temperature of one of the substrate and the mold to be 40° C. or greater. That is, in the present invention, the temperature of the substrate or the temperature of the mold which has been adjusted is assumed to be practically the same as the temperature of the resist layer. It is preferable for the mold to be released from the resist layer while the temperature of the resist layer is within a range from 50° C. to 120° C.

In the present invention, the temperature of the resist layer is designated as an in plane average temperature of an area corresponding to a pattern formation portion of the resist layer on the surface of the resist layer in contact with the substrate. Here, it is assumed that the temperature of the surface of the resist layer in contact with the substrate is practically the same as the temperature of the substrate in contact with said surface.

In the method for forming patterns of the present invention, it is preferable for the resist composition to further include a fluorine containing polymerizable compound. It is preferable for the fluorine containing polymerizable compound to be included in the resist composition at 5% by mass or less.

It is preferable for a fluorine containing polymerizable compound having monomers with a plurality of fluorine containing groups, which are at least one type of fluorine containing group selected from fluoroalkyl groups and fluoroalkyl ether groups, and at least two of the plurality of fluorine containing groups being separated by linking groups having a carbon number of 2 or greater, to be employed as the fluorine containing polymerizable compound. It is preferable for at least two of the fluorine containing groups to be fluoroalkyl groups having a carbon number of 2 or greater. Further, it is preferable for at least two of the fluorine containing groups to be trifluoromethyl groups.

In the method for forming patterns of the present invention, it is preferable for the surface of the substrate on which the resist layer is formed to be coated with an interfacial bonding agent that cross links the surface and the resist layer, prior to forming the resist layer on the substrate.

A method for producing patterned substrates of the present invention is characterized by comprising:

forming a resist layer on a substrate by the method for forming a pattern of the present invention; and forming a pattern of protrusions and recesses based on the pattern of the resist layer on the substrate, by executing a lithography method using the resist layer as a mask.

The method for forming patterns of the present invention is an optical imprinting method that employs a resist composition including a polymerizable compound that includes polyfunctional monomers that become polymers having three dimensional structures by cross linking when polymerized and a polymerization initiating agent which is activated by one of light and an electron beam on a substrate; and separates the mold from the resist layer under conditions that the temperature of the resist layer is 40° C. or greater. In this method, the mold is separated from the cured resist layer in a state in which the resist layer is deformable due to being heated. Therefore, the occurrence of pattern formation defects can be suppressed. In addition, the cured resist composition is a polymer having a three dimensional structure. Therefore, deformation due to forces applied while heated will not become plastic deformation. Therefore, pattern precision is favorably maintained after the mold is separated.

In the method for forming patterns of the present invention, the fluorine content within the resist composition can be low. Therefore, the viscosity of the resist composition and the etching resistance of the hardened resist material can be favorably maintained. In addition, the need to include a non polymerizable surfactant to improve mold release properties is obviated. Accordingly, deterioration of the mold due to adhesion of surfactants to the mold after mold release can be suppressed.

Accordingly, the present invention is capable of pattern formation by the imprinting method that realizes highly precise patterning even in nano order pattern formation, and is superior in productivity and etching resistance.

In addition, highly precisely patterned substrates can be produced by processing a substrate with a lithography method, using a resist pattern formed by the method for forming patterns of the present invention as a mask.

BRIEF DESCRIPTION OF THE DRAWINGS

FIG. 2 is a collection of sectional diagrams that schematically illustrate the steps of a method for forming patterns and a method for producing patterned substrates according to a second embodiment of the present invention.

BEST MODE FOR CARRYING OUT THE INVENTION

Figure 1:
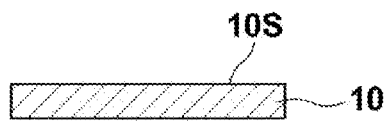
FIG. 1 is a collection of sectional diagrams that schematically illustrate the steps of a method for forming patterns and a method for producing patterned substrates according to a first embodiment of the present invention.
Figure 1:
Figure 1:
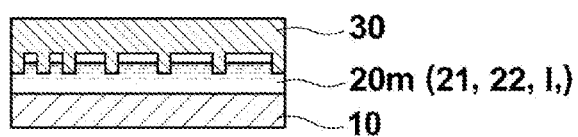
Figure 1:
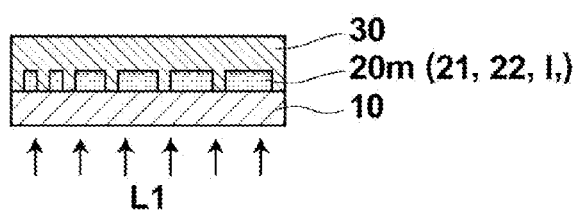
Figure 1:
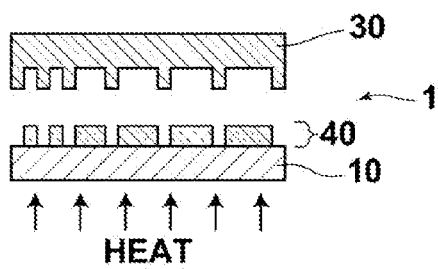
Figure 1:
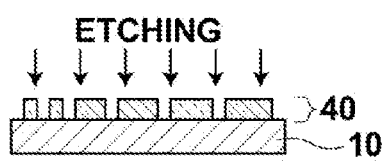
Figure 1:
Figure 1:

Methods for forming patterns and methods for producing patterned substrates according to embodiments of the present invention will be described with reference to FIG. 1 and FIG. 2. A through E of FIG. 1 are sectional diagrams that illustrate the steps of a method for forming patterns according to a first embodiment of the present invention. A through E of FIG. 2 are sectional diagrams that illustrate the steps of a method for forming patterns according to a second embodiment of the present invention. The methods by which resist layers are formed differ in the first embodiment and the second embodiment. The first embodiment will be described as a case in which a 20 nm thick resist layer is formed as a solid film on a substrate. The second embodiment will be described as a case in which a 20 nm thick resist layer is formed by discretely arranging a plurality of droplets of a resist composition. The dimensions and scales of the illustrated components are changed in order to facilitate visual understanding.

As illustrated in FIG. 1 and FIG. 2, the method for forming patterns of the present invention forms a resist layer 20*m* constituted by a resist composition 20 (which may include unavoidable impurities) including a polymerizable compound 21 that includes polyfunctional monomers that become polymers having three dimensional structures by cross linking when polymerized and a polymerization initiating agent I which is activated by light or an electron beam (light L1) on a substrate 10; presses a surface of a mold having a predetermined pattern of protrusions and recesses against the resist layer 20*m*; irradiates the light or the electron beam L1 onto the resist layer 20*m* to cure the resist layer 20*m*; and separates the mold from a cured resist layer 40 under conditions that the temperature of the resist layer 40 is 40° C. or greater. As described above, the first embodiment and the second embodiment differ in the method by which the resist layer 20*m* is formed on the substrate 10, and are the same with respect to the other steps. Each of the steps will be described hereinafter.

(Resist Coating Step-First Embodiment)

First, the substrate 10 is prepared (A of FIG. 1), and the resist layer 20*m* constituted by the resist composition 20 (which may include unavoidable impurities) including the polymerizable compound 21 that includes the polyfunctional monomers that become polymers having three dimensional structures by cross linking when polymerized and the polymerization initiating agent I which is activated by light or an electron beam L1 (hereinafter, referred to as "light L1") is formed on the substrate 10 (B of FIG. 1)

Although the substrate 10 is not particularly limited, a substrate having favorable surface flatness is preferred as the substrate 10. In the method for forming patterns of the present embodiment, the light L1 cures the resist layer 20m. Therefore, it is necessary for the substrate 10 or a mold 30 to be utilized at a later step to be transmissive with respect to the light L1. Here, the expression "transmissive" means a degree of transmissivity that enables an amount of the light L1 that enables the resist 20 to be cured to reach the resist layer 20m. If the transmissivity with respect to the light L1 is 1% or greater, it is possible to cure the resist 20. However, it is preferable for the transmissivity to be 10% or greater, and more preferably 50% or greater.

Examples of materials of the substrate 10 include: aluminum; glass; silicon; quartz; and $SiO_2/Si$, which is silicon having a thermally oxidized film formed on the surface thereof. These substrate materials may be used either singly or in combinations of two or more.

It is preferable for a surface process to be administered onto a pattern formation surface 10S of the substrate 10 that causes the surface 10S and the resist layer 20m to bond in close contact, prior to the resist layer 20m being formed. An example of such a surface process is that in which a coupling agent that includes a first functional group that bonds with the surface of the substrate and a second functional group that bonds with the resist layer 20m is formed as a film on the substrate as an interfacial bonding agent.

The first functional group is not particularly limited as long as it is capable of bonding with the surface of the substrate 10, and may be selected as appropriate from among known functional groups according to intended use. Examples of such functional groups include: alkoxysilane moieties; carboxylic acid anhydride moieties that have cross linking properties with OH groups; halogenated moieties; alcohol moieties; thiol moieties, amine moieties; phosphoric acid moieties; silicate moieties; titanate moieties; and alumina moieties.

The second functional group is not particularly limited as long as it is capable of bonding with the resist layer 20m (resist composition 20), and may be selected as appropriate from among known functional groups that can bond with the resist layer 20m by covalent bonds, hydrogen bonds, ionic bonds, Van der Waals bonds, etc. according to the composition of the resist composition.

In addition, it is preferable for the interfacial bonding agent to be that which does not hinder the removal of resist layer residue after processing of the substrate by etching or the like, in addition to strengthening the bonds between the substrate 10 and the resist layer 20m. Accordingly, it is preferable for the interfacial bonding agent to be that which can be removed after processing the substrate by one of an oxygen plasma process, an oxygen ashing process, and a UV ozone process.

Examples of such interfacial bonding agents include silane coupling agents and carboxylic acid anhydrides. The method by which the film of the interfacial bonding agent is formed is not particularly limited. Liquid phase methods such as the spin coat method, the spray coat method, the dip coat method, and the immersion method, or gas phase methods such as the vapor deposition method may be selected as appropriate.

In addition, a layer of still another material (a layer of a material which is difficult to etch, such as a metal) may be provided as a mask layer between the surface 10S of the substrate and the resist layer 20 (or the film of the interfacial bonding agent). Thereby, the processing margin of a subsequent etching process can be spread, by selecting the series of reactive gas, the resist, the substrate to be processed, and the reactive properties with respect to the provided mask layer, resulting in the production of a higher quality processed substrate.

The method by which the resist layer 20m is formed as a film is not particularly limited. Coating methods such as the spin coat method and the spray method are preferred. In addition, it is preferable for the average film thickness of the resist layer 20m to be within a range from 5 nm to 200 nm after the mold is pressed against the resist layer 20m.

It is only necessary for the resist composition 20 to include the polymerizable compound 21 that includes polyfunctional monomers that become polymers having three dimensional structures by cross linking when polymerized and the polymerization initiating agent I which is activated by the light L1. Other single function monomer components, coupling agents for coupling with the substrate, and volatile solvents may also be included.

In the method for forming patterns of the present embodiment, the cured resist layer 40 is heated to separate the mold therefrom in a state in which the resist layer 40 is at a temperature 40° C. or greater in the subsequent mold release step. Thereby, mold release becomes smooth, resulting in the realization of patterning having high precision, with smaller amounts of matter adhering to the mold, and high productivity.

In the conventional thermal imprinting method, thermoplastic resin is employed as a resist material. A mold is pressed against the resist material at a temperature in the vicinity of Tg, which is higher than room temperature, and pressure is applied. Thereby, the resist material enters into a pattern formed on the surface of the mold by fluidity of the resin and plastic deformation under high pressure, to mold the resist into the pattern. Thereafter, the temperature of the resist material is decreased to a temperature at which the shape of the pattern can be maintained, and the mold is separated from the resist material. If the mold is separated from the resist layer in a high temperature state, the polymer still has fluidity or is in a plastically deformable state, and therefore the shape of the pattern cannot be maintained, and a problem that patterning precision deteriorates will occur. For this reason, it is necessary to separate the mold from the resist material in a state in which the temperature during separation is less than Tg.

Meanwhile optical imprinting employs photocurable resin which has fluidity at room temperature. One of the merits of optical imprinting is that the heating cycle, which is necessary in the thermal imprinting method, is not required. The optical imprinting method has superior fine pattern formability and thinner residual films without requiring high pressure conditions to be applied to molds during imprinting. In addition, the temperature cycle that requires precise temperature control in order to achieve both patterning properties and mold release properties is obviated, resulting in another merit of reduced takt time (the time required to perform each imprinting operation). In addition, there are no concerns regarding macroscopic positional shifts of patterns due to differences in contraction/expansion rates of resin and substrates during heating, as in the thermal method.

In optical imprinting methods which are being developed recently, it has become standard procedure to introduce fluorine containing compounds to molds or resist compositions with the objective of reducing separation resistance during mold release, to achieve fine pattern formability and thinner residual films.

However, as described in the section "Background Art", fluorine containing compound mold release agents which are generally employed are likely to adhere to molds after mold release and accumulate thereon. As a result, pattern shape precision deteriorates and it is difficult to apply such techniques to patterns having sizes on the order of several tens of nanometers. In addition, there is a concern that use of such fluorine containing compounds will promote deterioration of molds.

The present inventors focused on the fact that if a cured resist layer is heated, the elastic modulus of the resist layer decreases, the degree of elongation at fracture increases, and the tolerance to elastic deformation increases. The present inventors conceived of a method, in which resist layers are heated during mold release, that improves the mold release properties of molds and enables highly precise patterning on a nano order without promoting deterioration of the molds. In addition, the present inventors conceived of a novel material design for a resist composition and heating control conditions (appropriate mold release temperature conditions) to be utilized in the method.

In the heating control conditions and the material design of the resist composition to be utilized in the method, it is important that changes in the shapes of patterns practically do not occur on either the macroscopic level or the microscopic level due to positional shifting caused by differences in the coefficients of thermal expansion of substrates during heating and due to plastic deformation, thereby not influencing the precision of patterns. Further, superior etching resistance properties during an etching step following mold release are also required in the resist composition.

That is, the present inventors found that it was possible to favorably maintain the shape of the pattern of the cured resist layer 40 even if the mold 30 is separated from the resist layer 40 in a state that the temperature thereof was increased to the appropriate mold release temperature range that imparts deformability, by employing the polymerizable compound 21 that includes polyfunctional monomers that become polymers having three dimensional structures by cross linking when polymerized as a main component.

During separation of the mold 30, forces received by the resist 40 become concentrated at specific areas in the resist 40 due to adhesive force between the mold 30 and the resist 40. Peeling of the resist 40 and pattern defects are likely to occur during separation at room temperature following optical imprinting utilizing the resist material of the present invention, or during separation at a temperature of Tg or less of a thermoplastic resin in following thermal imprinting utilizing the thermoplastic resin.

In the present invention, the cured resist layer 40 is a cross linked polymer. Therefore, the Young's modulus thereof decreases and deformation is facilitated when the resist layer 40 is heated. However, this deformation is not plastic deformation, but elastic deformation. Therefore, the shape of the pattern on the resist layer 40 returns to its original state when the forces that caused the deformation (in this case, forces applied due to separation) are released. In addition, the resist 40 after separation has favorable brittleness. Therefore, breakage during separation (during deformation) can also be suppressed. Accordingly, the method for forming patterns of the present invention enables separation of the mold 30 with favorable mold release properties, and can realize highly precise patterning.

The resist composition 20 may include monomer components having polyfunctional groups with one or more functions for the purpose of obtaining expression of cross linking properties, increasing carbon density, increasing the total amount of bonding energy, or improving etching resistance by suppressing the inclusion rates of moieties having high electronegativity, such as O, S, and N within the cured resin.

Further, coupling agents for coupling with the substrate, volatile solvents, antioxidant agents, etc. may be included as necessary.

The same agent used in the aforementioned close contact process for the substrate may be employed as the coupling agent for coupling with the substrate. With respect to the amount of the coupling agent, it is sufficient for the coupling agent to be included in an amount such that it is present at the interface between the substrate and the resist layer, and 10% by mass or less is preferable, 5% or less is more preferable, 2% by mass or less is still more preferable, and 0.5% by mass or less is most preferable.

The viscosity of solids (components excluding a volatile solvent component) in the resist composition 20 is preferably 1000 mPa·s or less, more preferably 100 mPa·s or less, and most preferably 20 mPa·s or less, from the viewpoint of dissolving of the solids into the resist composition and wet spreading properties with respect to the mold. However, in the case that the ink jet method is utilized, it is preferable for the viscosity of the resist composition to be 15 mPa·s or less at room temperature or at a temperature range to which a head can control the temperature during expulsion. It is also preferable for the surface tension of the resist composition to be within a range from 20 mN/m to 35 mN/m from the viewpoint of securing stable expulsion from ink jet heads.

The polymerizable compound is not particularly limited. However, it is preferable for the polymerizable compound 21 to be that which exhibits qualities such as accurate patterns and etching resistance after curing. The present inventors found that it is preferable for the polymerizable compound 21 to include polyfunctional monomers that become polymers having three dimensional structures by cross linking when polymerized, and that it is preferable for the polyfunctional monomers to have at least 1 bivalent or trivalent aromatic group.

In the case of resist that will have a three dimensional structure following curing (polymerization), the shape maintaining properties following the curing process is favorable. Therefore, plastic deformation of the pattern, caused by forces being applied to the resist due to adhesive force between the mold and resist during separation becoming concentrated at specific areas of the resist structure, is suppressed.

However, if the ratio of polyfunctional monomers that become a polymer having a three dimensional structure following polymerization or the density of the moiety that forms three dimensional cross links following polymerization is increased, the Young's modulus following polymerization will increase and the deformable properties will decrease. In addition, the brittleness of the film will deteriorate, and therefore there are concerns that the resist will become likely to fracture during mold release. Particularly in the case that a pattern having a width of 30 nm or less and a pattern aspect ratio of 2 or greater is formed such that the residual film thickness is 10 nm or less, it is considered that the probability that peeling and breakage of the pattern will occur will increase if pattern formation is attempted on a large area such as that of a hard disk pattern or a semiconductor pattern.

Accordingly, it is preferable for the polyfunctional monomers to be included in the polymerizable compound at 10% by mass or greater, more preferably at 20% by mass or greater, still more preferably at 30% by mass or greater, and most preferably at 40% by mass or greater.

In addition, it is preferable for a cross linking density expressed by Formula (C1) below to be within a range from $0.01/nm^2$ to $10/nm^2$, more preferably within a range from $0.1/nm^2$ to $6/nm^2$, and most preferably within a range from 0.5/nm² to 5.0/nm². The cross linking density of the composition may be calculated by obtaining the cross linking density of each molecule, then calculating a weight average. Alternatively, the cross linking density of the composition may be measuring the density of the composition after curing, then substituting weight averages of each of Mw and (Nf-1) into Formula (C1).

$$Da = \frac{Na \times Do}{Mw} \times (Nf - 1) \qquad \text{Formula (C1)}$$

wherein Da represents the cross linking density of a single molecule, Dc represents the density following curing, Nf represents the number of acrylate functional groups within a single monomer molecule, Na represents the Avogadro constant, and Mw represents molecular weight.

The polymerizable functional groups of the polymerizable compound 21 are not particularly limited. However, methacrylate groups and acrylate groups are preferred, as they have favorable reactive properties and stability.

Dry etching resistance can be evaluated by the Ohnishi parameter and the ring parameter of the resist composition. Dry etching resistance is superior as the Ohnishi parameter is smaller and the ring parameter is larger. In the present invention, it is preferable for the Ohnishi parameter of the resist composition 20 to be 4.0 or less, more preferably 3.5 or less, and most preferably 3.0 or less. In addition, it is preferable for the ring parameter of the resist composition to be 0.1 or greater, more preferably 0.2 or greater, and most preferably 0.3 or greater.

The above parameters are obtained by calculating material parameter values of substances that constitute the resist composition other than a volatile solvent component using formulas to be described later, based on their chemical structural formulas, then by averaging the calculated parameter values based on the compositional weight ratios of each substance, to obtain the parameter values for the composition as a whole. Accordingly, it is preferable for the polymerizable compound 21, which is the main component of the resist composition 20, to be selected taking the other components in the resist composition 20 and the above parameters into consideration.

Ohnishi Parameter=(Total Number of Atoms in Compound)/(Number of Carbon Atoms in Compound)−(Number of Oxygen Atoms in Compound)

Ring Parameter=(Mass of Carbon that forms Ring Structures)/(Total Mass of Compound)

Monomers which are a mixture of 1,4-diacryloyloxymethylbenzene and 2'-naphthylmethylacrylate and monomers which are a mixture of 1,4-diacryloyloxymethylbenzene and benzyl acrylate are preferred examples of the polymerizable compound 21. In addition, Aronix M220, which is a commercially available aliphatic polyfunctional monomer, and the like may be employed as the polyfunctional monomer.

The polymerizable monomers shown below and oligomers in which unit numbers of the polymerizable monomers are polymerized are preferred as the polymerizable compound 21. It is preferable for polymerizable monomers (Ax) and at least one of the compounds described in paragraphs [0032] through [0053] of Japanese Unexamined Patent Publication No. 2009-218550 to be included, from the viewpoint of both pattern formability and etching resistance.

—Polymerizable Monomer (Ax)—

Polymerizable monomer (Ax) is expressed by General Formula (I) below.

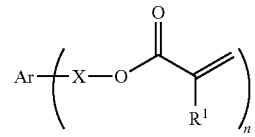

General Formula (I)

(In general Formula (I), Ar represents a bivalent or trivalent aromatic group that may have a substituent group, X represents a single bond or an organic linking group, $R^1$ represents a hydrogen atom or an alkyl group that may have a substituent group and n represents either 2 or 3.)

In General Formula (I), Ar represents a bivalent aromatic group (that is, an arylene group) when n=2, and represents a trivalent aromatic group when N=3. Examples of arylene groups include hydrocarbon series arylene groups, such as phenylene groups and naphthylene groups, and hetero arylene groups such as those having indole and carbazole as linking groups. Hydrocarbon series arylene groups are preferable, and among hydrocarbon series arylene groups, phenylene groups are more preferable from the viewpoint of viscosity and etching resistance. The arylene groups may have substituent groups. Preferred examples of substituent groups include: alkyl groups, alkoxy groups, hydroxyl groups, cyano groups, alkoxy carbonyl groups, amide groups, and sulfonic amide groups.

Examples of organic linking group represented by X include alkylene groups, arylene groups, and aralkylen groups that may include hetero atoms within chains. From among such organic linking groups, alkylene groups and oxyalkylene groups are preferable, and alkylene groups are more preferable. It is particularly preferable for X to be a single bond or an alkylene group.

$R^1$ is preferably a hydrogen atom or a methyl group, and more preferably a hydrogen atom. In the case that $R^1$ has a substituent group, examples of preferred substituent groups include hydroxyl groups, halogen atoms (excluding fluorine), alkoxy groups, and acyloxy groups. n is 2 or 3, and preferably 2.

It is preferable for the polymerizable monomer (Ax) to be a polymerizable monomer represented by the following General Formula (I-a) or General Formula (I-b).

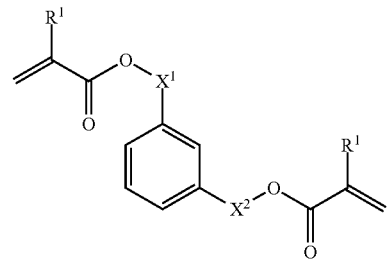

General Formula (I-a)

General Formula (I-b)

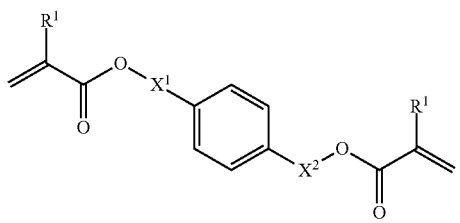

(In General Formulae (I-a) and (I-b), $X^1$ and $X^2$ respectively represent a single bond or an alkylene group with a carbon number from 1 to 3 that may have substituent groups, and $R^1$ represents a hydrogen atom or an alkyl group that may have substituent groups.)

In General Formula (I-a), $X^1$ is preferably a single bond or a methylene group, and more preferably a methylene group from the viewpoint of lowering viscosity. The preferable range of $X^2$ is the same as that for $X^1$.

$R^1$ in General Formulae (I-a) and (I-b) are the same as $R^1$ in General Formula (I), and the preferable range thereof is the same as that in General Formula (I).

It is preferable for the polymerizable monomer (Ax) to be a liquid at 25° C., because generation of foreign matter can be suppressed even when the amount thereof to be added is increased.

It is preferable for the viscosity of the polymerizable monomer (Ax) to be 70 mPa·s or less at 25° C., more preferably 50 mPa·s or less, and most preferably 30 mPa·s or less, from the viewpoint of pattern formability.

Specific preferred examples of the polymerizable monomer (Ax) will be indicated below. $R^1$ in the chemical formulas indicated below are the same as $R^1$ in General Formula (I). It is preferable for $R^1$ to be a hydrogen atom from the viewpoint of curing properties. Note that the present invention is not limited to these specific examples.

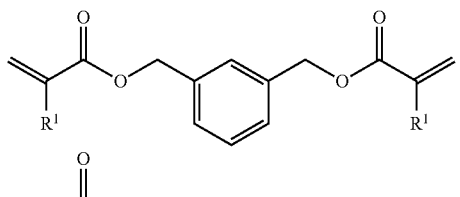

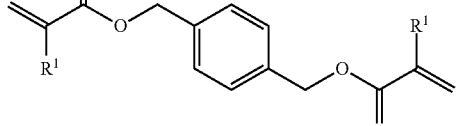

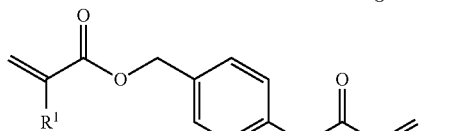

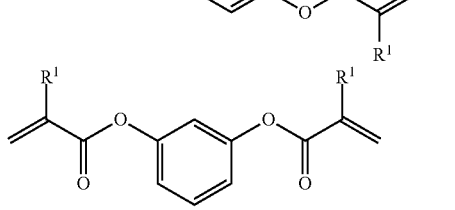

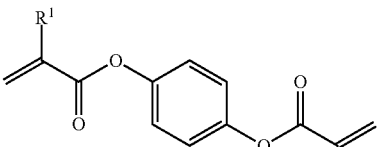

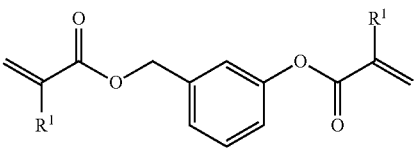

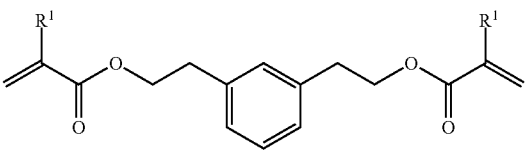

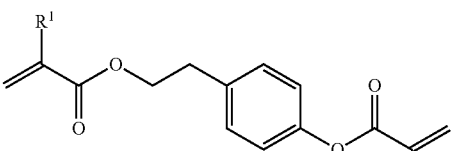

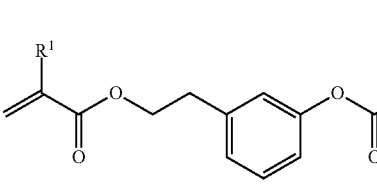

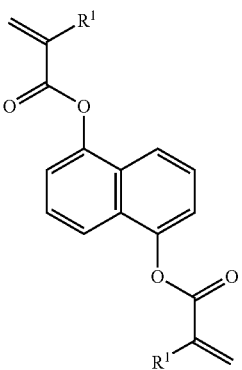

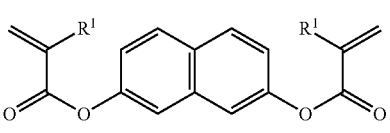

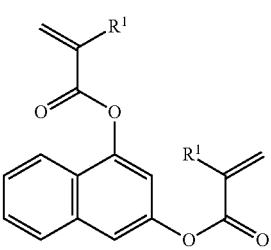

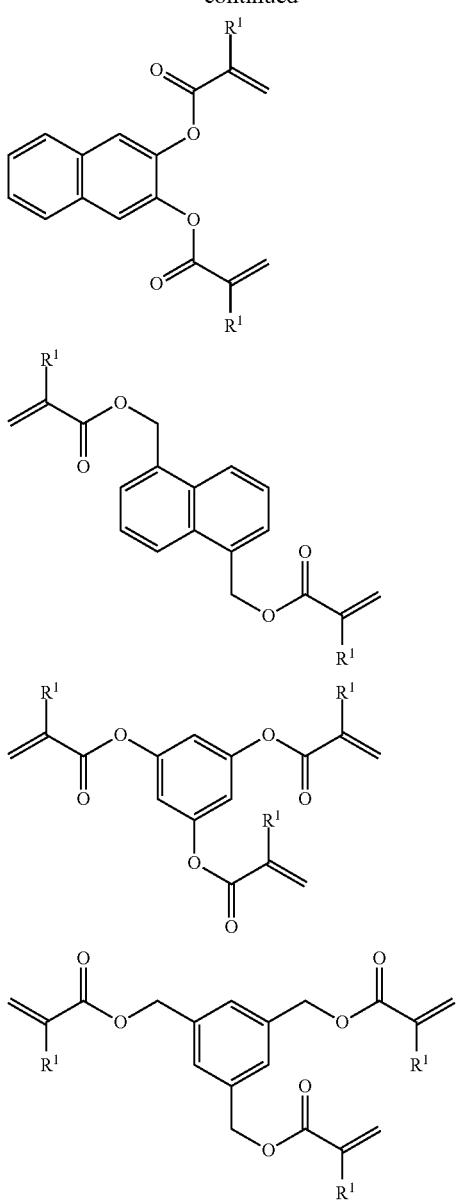

From among the above examples, the compounds indicated below are particularly preferable, because they are liquids at 25° C., have low viscosity, and exhibit favorable curing properties.

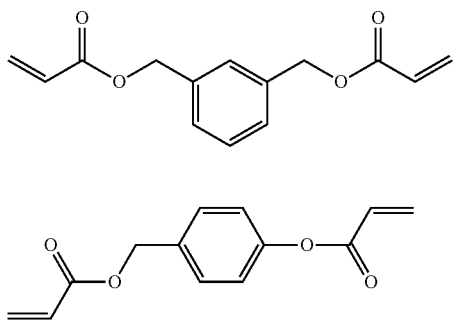

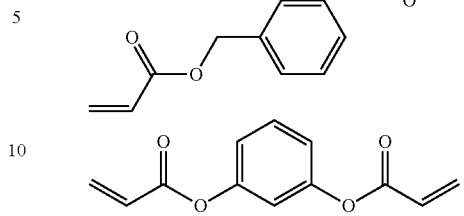

It is preferable for other polymerizable monomers described below, which are different from the polymerizable monomer (Ax), to be included in the resist composition in addition to the polymerizable monomer (Ax), from the viewpoints of improving composition viscosity, dry etching resistance, imprinting suitability, curing properties, etc.

—Other Polymerizable Monomers—

Polymerizable unsaturated monomers having groups with 1 to 6 ethylene unsaturated bonds, compounds having oxirane rings (epoxy compounds), vinyl ether compounds, styrene derivatives, compounds having fluorine atoms, propenyl ether, and butenyl ether are examples of the other polymerizable monomers. Polymerizable unsaturated monomers having groups with 1 to 6 ethylene unsaturated bonds are preferable from the viewpoint of curing properties.

From among these polymerizable polymers, the compounds described in paragraphs [0032] through [0053] of Japanese Unexamined Patent Publication No. 2009-218550 may be preferably included, from the viewpoints of imprinting suitability, dry etching resistance, curing properties, viscosity, and the like.

The polymerizable unsaturated monomers having groups with 1 to 6 ethylene unsaturated bonds (polymerizable unsaturated monomers having 1 to 6 functions) that can also be included will be described.

First, specific examples of polymerizable unsaturated monomers having groups with 1 ethylene unsaturated bond include: 2-acryloyloxy ethylphthalate; 2-acryloyloxy 2-hydroxyethylphthalate; 2-acryloyloxy ethylhexahydrophthalate; 2-acryloyloxy propylphthalate; 2-ethyl-2-butylpropanediol acrylate; 2-ethylhexyl (meth) acrylate; 2-ethylhexyl carbitol (meth) acrylate; 2-hydroxybutyl (meth) acrylate; 2-hydroxyethyl (meth) acrylate; 2-hydroxypropyl (meth) acrylate; 2-methoxyethyl (meth) acrylate; 3-methoxybutyl (meth) acrylate; 4-hydroxybutyl (meth) acrylate; acrylic acid dimmer; benzyl (meth) acrylate; 1- or 2-naphtyl (meth) acrylate; butanediol mono (meth) acrylate; Butoxyethyl (meth) acrylate; butyl (meth) acrylate; cetyl (meth) acrylate; denatured ethylene oxide (hereinafter, referred to as "EO"); cresol (meth) acrylate; dipropylene glycol (meth) acrylate; ethoxylated phenyl (meth) acrylate; ethyl (meth) acrylate; isoamyl (meth) acrylate; isobutyl (meth) acrylate; isooctyl (meth) acrylate; Cyclohexyl (meth) acrylate; isobornyl (meth) acrylate; Dicyclopentanyl (meth) acrylate; dicyclopentanyloxyethyl (meth) acrylate; isomyristyl (meth) acrylate; lauryl (meth) acrylate; methoxydipropylene glycol (meth) acrylate; methoxytripropylene glycol (meth) acrylate; methoxypolyethylene glycol (meth) acrylate; methoxytriethylene glycol (meth) acrylate; methyl (meth) acrylate; neopentylglycolbenzoate (meth) acrylate; nonylphenoxypolyethylene glycol (meth) acrylate; nonylphenoxypolypropylene glycol (meth) acrylate; octyl (meth) acrylate; paracumylphenoxyethylene glycol (meth) acrylate; epichlorohydrine (hereinafter referred to as "ECH") denatured phenoxyacrylate; phenoxyethyl (meth) acrylate; phenoxydiethylene glycol (meth) acrylate; phenoxyhexaethylene glycol (meth) acrylate; phenoxytetraethylene glycol (meth) acrylate; polyethylene glycol (meth) acrylate; polyethylene glycol-polypropylene glycol (meth) acrylate; polypropylene glycol (meth) acrylate; stearyl (meth) acrylate; EO denatured succinate (meth) acrylate; tert-butyl (meth) acrylate; tribromophenyl (meth) acrylate; EO denatured tribromophenyl (meth) acrylate; tridodecyl (meth) acrylate; p-isopropenyl phenol; styrene; α-methyl styrene; and acrylonitryl.

From among these, monofunctional (meth) acrylates having aromatic structures and/or aliphatic hydrocarbon structures are particularly preferable from the viewpoint of improving etching resistance. As specific examples of such monofunctional (meth) acrylates, benzyl (meth) acrylate, dicyclopentanyl (meth) acrylate, dicyclopentanyloxyethyl (meth) acrylate, isoboronyl (meth) acrylate, adamantyl (meth) acrylate are preferable, and benzyl (meth) acrylate is particularly preferable.

Polyfunctional polymerizable unsaturated monomers having groups that include two ethylene unsaturated bonds are also preferred as the other polymerizable monomers. Specific examples of polymerizable unsaturated monomers having groups with 2 ethylene unsaturated bonds include: diethylene glycol monoethylether (meth) acrylate; dimethylol dicyclopentane di (meth) acrylate; di (meth) acrylated isocyanulate; 1,3-butyrene glycol di (meth) acrylate; 1,4-butanediol di (meth) acrylate; EO denatured 1,6-hexanediol di (meth) acrylate; ECH denatured 1,6-hexanediol di (meth) acrylate; aryloxy polyethylene glycol acrylate; 1,9-nonanediol di (meth) acrylate; EO denatured bisphenol A di (meth) acrylate; PO denatured bisphenol A di (meth) acrylate; denatured bisphenol A di (meth) acrylate; EO denatured bisphenol F di (meth) acrylate; ECH denatured hexahydrophthalic diacrylate; hydroxypivalate neopentyl glycol di (meth) acrylate; neopentyl glycol di (meth) acrylate; EO denatured neopentyl glycol diacrylate; propylene oxide (hereinafter, referred to as "PO") denatured neopentyl glycol diacrylate; caprolactone denatured hydroxypivalate ester neopentyl glycol; stearic acid denatured pentaerythritol di (meth) acrylate; ECH denatured phthalate di (meth) acrylate; poly(ethylene glycol-tetramethylene glycol) di (meth) acrylate; poly(propylene glycol-tetramethylene glycol) di (meth) acrylate; polyester (di) acrylate; polyethylene glycol di (meth) acrylate; polypropylene glycol di (meth) acrylate; ECH denatured propylene glycol di (meth) acrylate; silicone di (meth) acrylate; triethylene glycol di (meth) acrylate; tetraethylene glycol di (meth) acrylate; dimethylol tricyclodecane di (meth) acrylate; neopentyl glycol denatured trimethylol propane di (meth) acrylate; tripropylene glycol di (meth) acrylate; EO denatured tripropylene glycol di (meth) acrylate; triglycerol di (meth) acrylate; dipropylene glycol di (meth) acrylate; divinyl ethylene urea; and divinyl propylene urea.

Among these, neopentyl glycol di (meth) acrylate; 1,9-nonanediol di (meth) acrylate; tripropylene glycol di (meth) acrylate; tetraethylene glycol di (meth) acrylate; hydroxypivalate neopentyl glycol di (meth) acrylate; polyethylene glycol di (meth) acrylate; and the like are particularly preferred.

Examples of polyfunctional polymerizable unsaturated monomers having groups with 3 ethylene unsaturated bonds include: ECH denatured glycerol tri (meth) acrylate; EO denatured glycerol tri (meth) acrylate; PO denatured glycerol tri (meth) acrylate; pentaerythritol triacrylate; EO denatured phosphate triacrylate; trimethylol propane tri (meth) acrylate; caprolactone denatured trimethylol propane tri (meth) acrylate; EO denatured trimethylol propane tri (meth) acrylate; PO denatured trimethylol propane tri (meth) acrylate; tris (acryloxyethyl) isocyanylate; dipentaerythritol hexa (meth) acrylate; caprolactone denatured dipentaerythritol hexa (meth) acrylate; dipentaerythritol hydroxy penta (meth) acrylate; alkyl denatured dipentaerythritol penta (meth) acrylate; dipentaerythritol poly (meth) acrylate; alkyl denatured dipentaerythritol tri (meth) acrylate; ditrimethylol propane tetra (meth) acrylate; pentaerythritol ethoxy tetra (meth) acrylate; and pentaerythritol tetra (meth) acrylate.

Among these, EO denatured glycerol tri (meth) acrylate; PO denatured glycerol tri (meth) acrylate; trimethylol propane tri (meth) acrylate; EO denatured trimethylol propane tri (meth) acrylate; PO denatured trimethylol propane tri (meth) acrylate; dipentaerythritol hexa (meth) acrylate; pentaerythritol ethoxy tetra (meth) acrylate; pentaerythritol tetra (meth) acrylate; and the like are favorably employed in the present invention.

Examples of compounds having oxirane rings (epoxy compounds) include: hydrogenated compounds, such as polybasic acid polyglycidyl esters, polyhydroxy alcohol polyglycidyl ethers, polyoxyalkylene glycol polyglycidyl ethers, aromatic polyol polyglycidyl ethers, and aromatic polyol polyglycidyl ethers; urethane polyepoxy compounds; and epoxylated polybutadienes. These compounds may be used singly or in combinations of two or more.

Specific examples of the compounds having oxirane rings (epoxy compounds) that can be favorably utilized in the present invention include: polyether polyol polyglycidyl ethers, obtained by adding one or more types of alkylene oxides to an aliphatic polyhydroxy alcohol, such as bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylol propane triglycidyl ether, polyethylene glycol diglycidyl ether, polypropylene glycol diglycidyl ether, ethylene glycol, propylene glycol, and glycerin; aliphatic long chain dibasic acid diglycidyl esters; aliphatic higher alcohol monoglycidyl ethers; polyether alcohol monoglycidyl ethers, such as phenol, cresol, butylphenol, and those obtained by adding alkylene oxide to phenol, cresol, and butylphenol; and higher aliphatic acid glycidyl esters.

Among these, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylol propane triglycidyl ether, neopentyl glycol diglycidyl ether, polyethylene glycol diglycidyl ether, and polypropylene glycol diglycidyl ether are particularly preferred.

Commercially available products that can be favorably utilized as glycidyl containing compounds include: UVR-6216 (by Union Carbide Co.); Glycyclol, AOEX24, and Cyclomer A200 (by Daicel Chemical Industries, K.K.); Epicoat 828, Epicoat 812, Epicoat 1031, Epicoat 872, and Epicoat CT508 (by Yuka Shell, K.K.); and KRM-2400, KRM-2410, KRM-2408, KRM-2490, KRM-2720, and KRM-2750 (by Asahi Denka Industries, K.K.). These products may be used either singly or in combinations of two or more.

The methods by which the compounds having oxirane rings are produced are not limited. These compounds may be synthesized by referring to the disclosures of: "*Experimental Chemistry Lessons,* 20 *Organic Syntheses II*", Maruzen K.K. Press, pp. 213-224, 2002; A. Hasfner, Ed., "*The chemistry of*

*heterocyclic compounds—Small Ring Heterocycles Part 3, Oxiranes"*, John Wiley and Sons, An Interscience Publication, New York, pp. 15-57, 1985; N. Yoshimura, "Typical synthetic reaction of epoxy resin. 1"*Adhesives*, Vol. 29, No. 12, pp. 32-38, 1985; N. Yoshimura, "Typical synthetic reaction of epoxy resin. 2", *Adhesives*, Vol. 30, No. 5, pp. 43-46, 1986; N. Yoshimura, "Typical synthetic reaction of epoxy resin. 3", *Adhesives*, Vol. 30, No. 7, pp. 42-46, 1986; Japanese Unexamined Patent Publication No. H11 (1999)-100378; and Japanese Patent No. 2926262.

Vinyl ether compounds may be used in combination as the other polymerizable monomers to be employed by the present invention. Known vinyl ether compounds may be selected. Examples of vinyl ether compounds include: 2-ethylhexyl vinyl ether; butanediol-1,4-divinyl ether; diethylene glycol monovinyl ether; ethylene glycol divinyl ether; triethylene glycol divinyl ether; 1,2-propanediol divinyl ether; 1,3-propanediol divinyl ether; 1,3-butanediol divinyl ether; 1,4-butanediol divinyl ether; tetramethylene glycol divinyl ether; neopentyl glycol divinyl ether; trimethylol propane trivinyl ether; trimethylol ethane trivinyl ether; hexanediol divinyl ether; tetraethylene glycol divinyl ether; pentaerythritol divinyl ether; pentaerythritol trivinyl ether; pentaerythritol tetravinyl ether; sorbitol tetravinyl ether; sorbitol pentavinyl ether; ethylene glycol diethylene vinyl ether; triethylene glycol diethylene vinyl ether; ethylene glycol dipropylene vinyl ether; triethylene glycol diethylene vinyl ether; trimethylol propane triethylene vinyl ether; trimethylol propane diethylene vinyl ether; pentaerythritol diethylene vinyl ether; pentaerythritol triethylene vinyl ether; pentaerythritol tetraethylene vinyl ether; 1,1,1-tris [4-(2-vinyloxyethoxy) phenyl] ethane; and bisphenol A divinyloxyethyl ether.

These vinyl ether compounds may be synthesized by the method disclosed in S. C. Lapin, "Vinyl ether functionalized urethane oligomers: an alternative to acrylate based systems", Polymers Paint Colour Journal, Vol. 179, No. 4237, pp. 321-328, 1988. That is, the vinyl ether compounds may be synthesized by a reaction between a multivalent alcohol or a multivalent phenol and acetylene, or by a reaction between a multivalent alcohol or a multivalent phenol and halogenated alkyl vinyl ether. The vinyl ether compounds may be used either singly or in combinations of two or more.

In addition, styrene derivatives may be utilized as the other polymerizable monomers in the present invention. Examples of styrene derivatives include: styrene; p-methyl styrene; p-methoxy styrene; β-methyl styrene; p-methyl-β-methyl styrene; α-methyl styrene; p-methoxy-β-methyl styrene; and p-hydroxy styrene.

In addition, compounds having fluorine atoms, such as: trifluoroethyl (meth) acrylate; pentafluoroethyl (meth) acrylate; (perfluorobutyl)ethyl (meth) acrylate; perfluorobutylhydroxy propyl (meth) acrylate; (perfluorohexyl)ethyl (meth) acrylate; octafluoropentyl (meth) acrylate; perfluorooctyl ethyl (meth) acrylate; and tetrafluoro propyl (meth) acrylate, may be used in combination with the polymerizable compound, in order to improve coating properties and release properties with respect to the mold.

Propenyl vinyl ethers and butenyl ethers may be utilized as the other polymerizable monomers in the present invention. Examples of the propenyl vinyl ethers and butenyl ethers include: 1-dodecyl-1-propenyl ether; 1-dodecyl-1-butenyl ether; 1-butaneoxymethyl-2-norbornene; 1-4-di(1-butaneoxy) butane; 1,10-di(1-butaneoxy) decane; 1,4-di(1-butaneoxymethyl) cyclohexane; diethylene glycol di(1-butenyl) ether; 1,2,3-tri (1-butaneoxy) propane; and propenyl ether propylene carbonate.

(Fluorine Containing Polymerizable Compound)

A fluorine containing polymerizable compound 22 is not particularly limited as long as it is a polymerizable compound such as monomers or oligomers having at least one functional group with a fluorine atom and at least one polymerizable functional group. However, it is preferable for the fluorine containing polymerizable compound to be that having a configuration that facilitates polymerization with the polymerizable compound 21.

In the present embodiment, the fluorine containing compound 22 will become a part of a resist pattern. Therefore, it is preferable for the fluorine containing compound 22 to be that having favorable resist properties, such as pattern formability, mold release properties after curing, and etching resistance.

The amount of the fluorine containing compound 22 to be included in the resist composition 20 is within a range from 0.001% by mass to 5% by mass, for example, more preferably within a range from 0.002% by mass to 4% by mass, and most preferably within a range from 0.005% by mass to 3% by mass. In the case that two or more types of fluorine containing compounds are employed, the total amount thereof should be within the above ranges. If the amount of the fluorine containing compound 22 included in the resist composition 20 is within a range from 0.001% by mass to 5% by mass, coating uniformity is favorable, and deterioration in mold transfer properties and deterioration in etching suitability in an etching step following imprinting due to an excess amount of fluorine containing compound being included becomes less likely to occur.

It is preferable for the side chains, and particularly the ends, of the fluorine containing compound 22 to have polymerizable functional groups. Examples of polymerizable functional groups include: radical polymerizable functional groups, such as (meth) acrylate groups, (meth) acryl amide groups, vinyl groups, and aryl groups; and cationic polymerizable functional groups, such as epoxy groups, oxytanyl groups; and vinyl ether groups. Radical polymerizable functional groups are preferable, and among these, ethylene unsaturated bond groups such as (meth) acrylate groups are more preferable.

Fluorine containing groups selected from fluoroalkyl groups and fluoroalkyl ether groups are preferable as groups having fluorine atoms in the fluorine containing polymerizable compound 22.

Fluoroalkyl groups having a carbon number of 2 or greater are preferred as fluoroalkyl groups. It is more preferable for the fluoroalkyl groups to have a carbon number of 4 or greater. The upper limit of the carbon number is not particularly determined, but 20 or less is preferable, 8 or less is more preferable, and 6 or less is still more preferable. Fluoroalkyl groups having a carbon number within a range from 4 to 6 are most preferable. Examples of such preferable fluoroalkyl groups include: trifluoromethyl groups, pentafluoroethyl groups, heptafluoropropyl groups, hexafluoroisopropyl groups, nonafluorobutyl groups, tridecafluorohexyl groups, and heptadecafluorooctyl groups.

In the method for forming patterns of the present invention, it is preferable for the fluorine containing polymerizable compound 22 to be a polymerizable compound having a trifluoromethyl group structure with a fluorine atom. That is, it is preferable for at least one of the fluoroalkyl groups to have a trifluoromethyl group structure. It is preferable for fluoroalkyl ether groups to have a trifluoromethyl group in the same manner as the fluoroalkyl groups. Fluoroalkyl ether groups having perfluoroethylene oxy groups or perfluoropropylene oxy groups are preferred. Fluoroalkyl ether units having trifluoromethyl groups such as —(CF(CF$_3$)CF$_2$O)— and/or fluoroalkyl ether groups having trifluoromethyl groups at the ends thereof are preferred.

In the method for forming patterns of the present invention, a particularly preferable fluorine containing polymerizable compound 22 is that having polymerizable monomers with a plurality of fluorine containing groups, which are at least one type of fluorine containing group selected from fluoroalkyl groups and fluoroalkyl ether groups, and at least two of the plurality of fluorine containing groups being separated by linking groups having a carbon number of 2 or greater. That is, in the case that the polymerizable monomers have two fluorine containing groups, the two carbon containing groups are separated by linking groups having a carbon number of 2 or greater. In the case that the polymerizable monomers have three or more fluorine containing groups, at least two of the fluorine containing groups are separated by linking groups having a carbon number of 2 or greater, while the remaining fluorine containing groups may be bonded in any manner. The linking groups having a carbon number of 2 or greater are linking groups having at least two carbon atoms which are not substituted by fluorine atoms.

From a similar viewpoint, polymerizable monomers having three or more trifluoromethyl group structures are also preferable. Polymerizable monomers having three to nine trifluoromethyl group structures are preferable, and polymerizable monomers having four to six trifluoromethyl group structures are more preferable. A branched fluoroalkyl group having one fluorine containing group with two or more trifluoromethyl groups, for example, a —CH(CF$_3$)$_2$ group, a —C(CF$_3$)$_3$ group, or a —CCH$_3$(CF$_3$)$_2$CH$_3$ group, is preferable as a compound having three or more trifluoromethyl groups.

It is preferable for the fluoroalkyl ether groups to have trifluoromethyl groups. It is preferable for the fluoroalkyl ether groups to have perfluoroethylene oxy groups or perfluoropropylene oxy groups. Fluoroalkyl ether units having trifluoromethyl groups such as —(CF (CF$_3$)CF$_2$O) and/or fluoroalkyl ether groups having trifluoromethyl groups at the ends thereof are preferable.

Examples of functional groups which are included in the linking groups having a carbon number of 2 or greater include; alkylene groups, ester groups, sulfide groups, and arylene groups. It is particularly preferable for the linking groups having a carbon of 2 or greater to have ester groups and/or sulfide groups as functional groups.

It is preferable for the linking groups having a carbon number of 2 or greater to be alkylene groups, ester groups, sulfide groups, arylene groups, and combinations thereof.

These groups may have substituent groups within a range that does not stray from the scope of the present invention.

It is preferable for the total number of fluorine atoms in the fluorine containing polymerizable compound to be within a range from 6 to 60 per molecule, more preferably within a range from 9 to 40 per molecule, and most preferably within a range from 9 to 40 per molecule.

It is preferable for the fluorine containing polymerizable compound 22 to be a polymerizable compound having fluorine atoms in which the fluorine content defined below is within a range from 20% to 60%. In the case that the fluorine containing polymerizable compound 22 is constituted by polymerizable monomers, it is preferable for the fluorine content to be within a range from 20% to 60%, and more preferably within a range from 35% to 60%. In the case that the fluorine containing polymerizable compound 22 is constituted by oligomers having polymerizable groups, it is preferable for the fluorine content to be within a range from 20% to 50%, and more preferably within a range from 20% to 40%. By setting the fluorine content to be in an appropriate range, superior compatibility with other components will be achieved, contamination of the mold can be reduced, and favorable mold release properties can be obtained. As a result, repeated pattern formability, which is an advantageous effect of the present invention, will be improved. In the present specification, the fluorine content is represented by Formula (C2) below:

$$FluorineContent = \frac{(FluorineAtomsInPolymerizableCompound) \times (AtomicWeightOfFluorine)}{MolecularWeight \text{ of } PolymerizableCompound} \times 100 \quad \text{Formula (C2)}$$

An example of a preferred fluorine containing polymerizable compound 22 is a compound (monomer) having a group with a fluorine atom, having a partial structure represented by General Formula (II-a) below. By employing a compound having such a partial structure, pattern formability will remain superior even if pattern transfer is repeatedly performed, and the stability of the composition over time will be favorable.

—CH$_2$CH$_2$—C$_n$F$_{2n+1}$   General Formula (II-a)

(in General Formula (II-a), n represents an integer from 1 to 8, and preferably an integer from 4 to 6).

Another example of a preferred fluorine containing polymerizable compound 22 is a compound having a partial structure represented by General Formula (IV) below. The compound may have both the partial structure represented by General Formula (II) and the partial structure represented by General Formula (II-b).

General Formula (II-b)

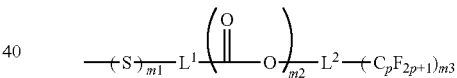

(in General Formula (II-b), L$^1$ represents a single bond or an alkylene group having a carbon number from 1 to 8, L$^2$ represents an alkylene group having a carbon number from 1 to 8, m1 and m2 respectively represent 0 or 1, wherein at least one of m1 and m2 is 1. m3 represents an integer from 1 to 3, p represents an integer from 1 to 8 and —C$_p$F$_{2p+1}$ may be the same or different when m3 is 2 or greater.)

It is preferable for both L$^1$ and L$^2$ to be an alkylene group having a carbon number from 1 to 4. In addition, the alkylene groups may have substituent groups within a range that does not stray from the scope of the present invention. m3 is preferably 1 or 2. It is preferable for p to be an integer within a range from 4 to 6.

A polymerizable monomer represented by General Formula (II-c) below is preferred.

General Formula (II-c)

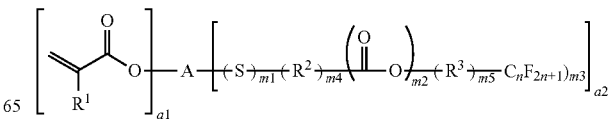

(in General Formula (II-c), $R^1$ represents a hydrogen atom, an alkyl group, a halogen atom, or a cyano group; A represents a linking group having a valence of (a1+a2), and a1 represents an integer from 1 to 6. a2 represents an integer from 2 to 6, and $R^2$ and $R^3$ respectively represent an alkylene group having a carbon number from 1 to 8. m1 and m2 respectively represent 0 or 1, wherein at least one of m1 and m2 is 1. m3 represents an integer from 1 to 3. m4 and m5 respectively represent 0 or 1, wherein at least one of m4 and m5 is 1. m4 is 1 when both m1 and m2 are 1. n represents an integer from 1 to 8.)

It is preferable for $R^1$ to be a hydrogen atom or an alkyl group, more preferable for $R^1$ to be a hydrogen atom or a methyl group, and most preferable for $R^1$ to be a hydrogen atom.

It is preferable for A to be a linking group having an alkylene group and/or an arylene group, and may further include a linking group that has a hetero atom. Examples of linking groups having hetero atoms include: —O—; —C(=O)O—; —S—; and —C(=O)—. These groups may have substituent groups within a range that does not stray from the scope of the present invention, but it is preferable for these groups to not have substituent groups. It is preferable for the carbon number of A to be within a range from 2 to 50, and more preferably within a range from 4 to 15.

a1 is preferably 1 to 3, and more preferably 1 or 2. a2 is preferably 2 or 3, and more preferably 2.

When a1 is 2 or greater each A may be the same or different.

When a2 is 2 or greater, each $R^2$, $R^3$, m1, m2, m3, m4, m5, and n may be the same or different.

It is preferable for the molecular weight of the polymerizable monomers to be employed as the fluorine containing polymerizable compound 22 to be within a range from 500 to 2000. In addition, it is preferable for the viscosity of the polymerizable monomers to be within a range from 600 to 1500, and more preferably within a range from 600 to 1200.

Specific examples of the polymerizable monomers to be employed as the fluorine containing polymerizable compound 22 will be indicated below. However, the present invention is not limited to these specific examples. $R^1$ in the following formulae are one of a hydrogen atom, an alkyl group, a halogen atom, and a cyano group, respectively.

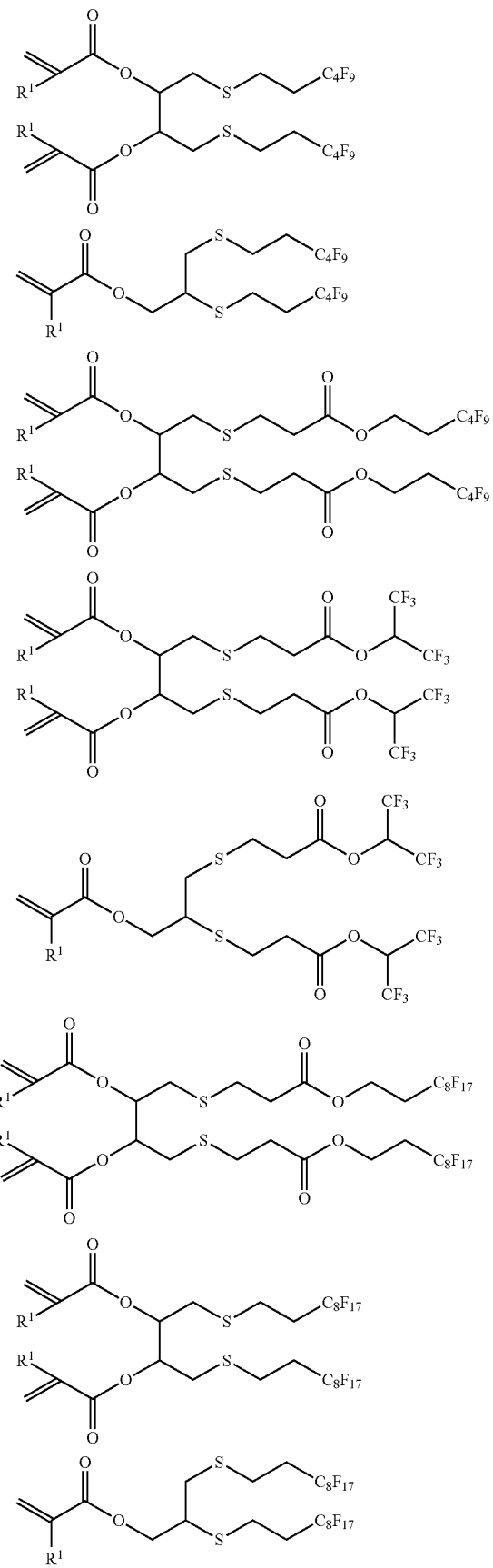

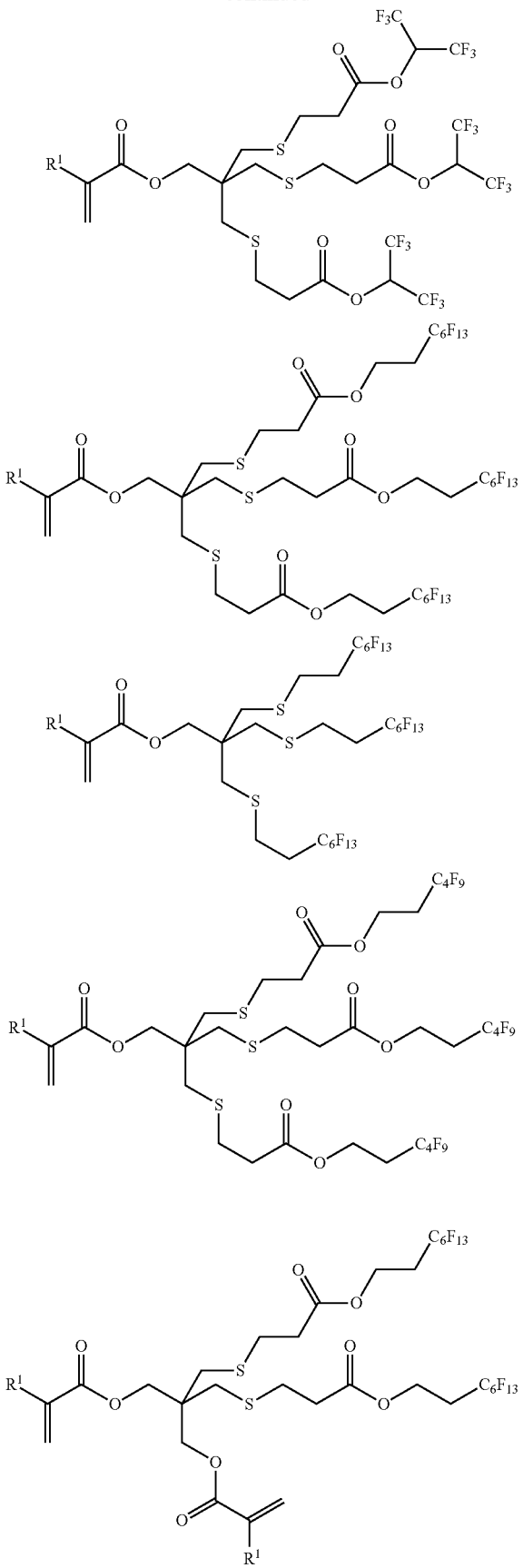

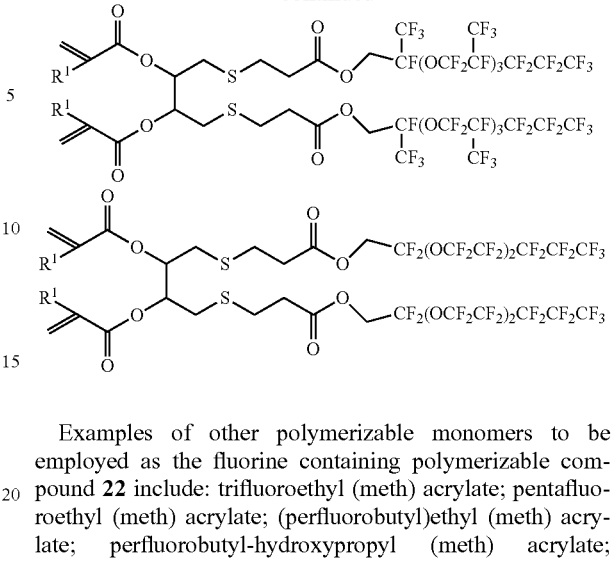

Examples of other polymerizable monomers to be employed as the fluorine containing polymerizable compound 22 include: trifluoroethyl (meth) acrylate; pentafluoroethyl (meth) acrylate; (perfluorobutyl)ethyl (meth) acrylate; perfluorobutyl-hydroxypropyl (meth) acrylate; (perfluorohexyl) ethyl (meth) acrylate; octafluoropentyl (meth) acrylate; perfluorooctylethyl (meth) acrylate; tetrafluoropropyl (meth) acrylate; and hexafluoropropyl (meth) acrylate, which are monofunctional polymerizable compounds having fluorine atoms. Preferred examples of polymerizable compounds having fluorine atoms include polyfunctional polymerizable compounds having two or more polymerizable functional groups, such as: 2,2,3,3,4,4-hexafluoropentane di (meth) acrylate; 2,2,3,3,4,4,5,5-octafluorohexane di (meth) acrylate.

In addition, compounds having two or more fluorine containing groups, such as fluoroalkyl groups and fluoroalkyl ether groups per molecule can also be favorably employed.

In the case that the fluorine containing polymerizable compound is constituted by oligomers, it is preferable for the oligomers to include the aforementioned polymerizable monomers as repetitive units.

In addition, the compounds described in paragraphs [0018] through [0048] of Japanese Unexamined Patent Publication No. 2006-114882 and the polymerizable compounds described in paragraphs through [0035] of Japanese Unexamined Patent Publication No. 2008-095037 may also be utilized as the fluorine containing polymerizable compound.

Specific examples of synthesized fluorine containing polymerizable compounds 22 to be utilized in the present invention will be described.

SYNTHESIZED EXAMPLE 1

(Synthesis of Fluorine Containing Monomer Ax-1)

45 ml of ethanol and 5 ml of water were added to 2 g of thioerythritol to dissolve the thioerythritol. Then, 1.1 g of sodium hydroxide was added to the solution and the solution was stirred for 30 minutes at room temperature. Then, 0.2 g, 15.4 g of perfluorohexylethyl iodide was added to the solution, and caused to react for 7 hours at 90° C. Ethyl acetate was added to the reaction liquid, then an organic phase was cleansed with water and a saturated saline solution in this order. The cleansed organic phase was dried and concentrated to obtain (Ax-1a).

6.7 g of (Ax-1a) was dissolved in 80 ml of acetone, and 3.2 g of triethylamine was added to this solution. Further, 2.5 g of ice chilled acrylic acid chloride was dripped into the solution. The solution was maintained at room temperature for 20 hours after the acrylic acid chloride was added to cause reactions to occur. Then, 50 ml of water was added to the reaction liquid, and extraction was performed using acetic ether. An organic phase was cleansed with a 1N-hydrochloric acid solution, a saturated sodium hydrogen carbonate solution, and a saturated saline solution. The cleansed organic phase was dried and concentrated to obtain a crude product. The crude product was purified by column chromatography, and 2.8 g of the polymerizable monomer Ax-1 was obtained.

$^1$H-NMR (CDCl$_3$): δ2.2-2.5 (m, 4H), δ2.7-3.0 (m, 8H), δ5.4 (m, 2H), δ5.95 (d, 2H), δ6.1 (dd, 2H), δ6.45 (d, 2H)

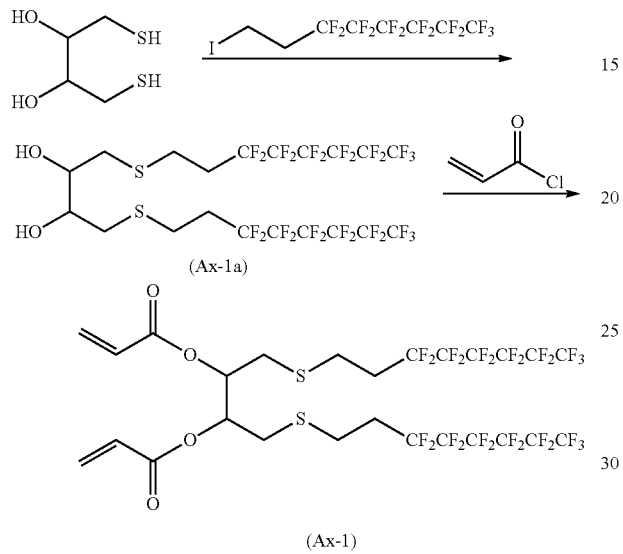

(Ax-1a)

(Ax-1)

SYNTHESIZED EXAMPLE 2

(Synthesis of Polymerizable Monomer Ax-2)

2 g of dithioerythritol was dissolved in 20 ml of acetic ether, then 0.2 g of triethyl amine and 11.4 g of perfluorohexylethyl acrylate was added to the solution, and caused to react for four hours at room temperature. 4.0 g of triethyl amine and acetic ether 20 ml were added to the reaction liquid, then 2.9 g of ice chilled acrylic acid chloride was dripped into the reaction liquid. The solution was maintained at room temperature for 20 hours after the acrylic acid chloride was added to cause reactions to occur. Then, 50 ml of water was added to the reaction liquid, and the mixture was stirred. An organic phase was cleansed with a 1N-hydrochloric acid solution, a saturated sodium hydrogen carbonate solution, and a saturated saline solution. The cleansed organic phase was dried and concentrated to obtain a crude product. The crude product was purified by column chromatography, and 3 g of the polymerizable monomer Ax-2 was obtained.

$^1$H-NMR (CDCl$_3$): δ2.4-3.0 (m, 16H), δ4.4 (t, 4H), δ5.4 (m, 2H), δ5.9 (d, 2H), δ6.1 (dd, 2H), δ6.45 (d, 2H)

SYNTHESIZED EXAMPLE 3

The same methods as used in the Synthesized Examples 1 and 2 above were employed to synthesize polymerizable monomers (Ax-3) through (Ax-7).

$^1$H-NMR (CDCl$_3$):

(Ax-3)

δ2.3-2.6 (m, 4H), δ2.8-3.0 (m, 6H), δ3.1 (m, 1H), δ4.4 (m, 2H), δ5.9 (d, 2H), δ6.1 (dd, 2H), δ6.45 (d, 2H)

(Ax-4)

δ2.2-2.6 (m, 4H), δ2.7-3.0 (m, 8H), δ5.4 (m, 2H), δ5.95 (d, 2H), δ6.1 (dd, 2H), δ6.45 (d, 2H)

(Ax-5)

δ2.8-3.0 (m, 12H), δ5.4 (m, 2H), δ5.8 (m, 2H), δ5.9 (d, 2H), δ6.1 (dd, 2H), δ6.45 (d, 2H)

(Ax-6)

δ2.8-3.0 (m, 12H), δ3.1 (m, 1H), δ4.4 (m, 2H), δ5.8 (m, 2H), δ5.9 (d, 1H), δ6.1 (dd, 1H), δ6.45 (d, 1H)

(Ax-7)

δ2.3-2.6 (m, 4H), δ2.8-3.0 (m, 6H), δ3.1 (m, 1H), δ4.4 (m, 2H), δ5.9 (d, 2H), δ6.1 (dd, 2H), δ6.45 (d, 2H)

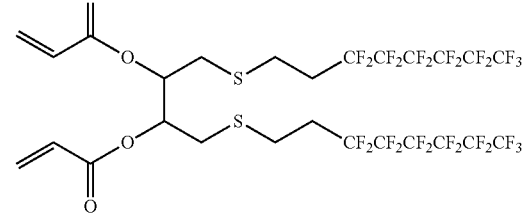

(Ax-1)

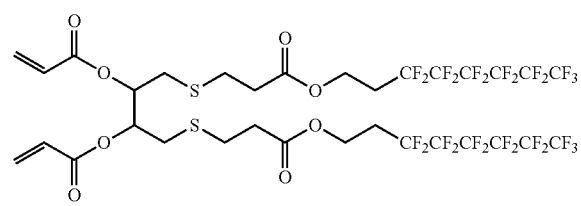

(Ax-2)

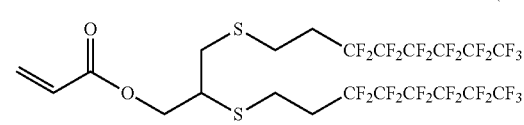

(Ax-3)

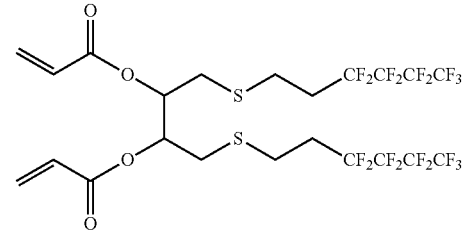

(Ax-4)

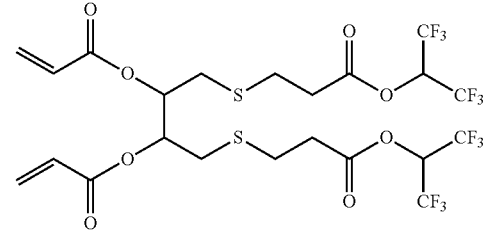

(Ax-5)

-continued

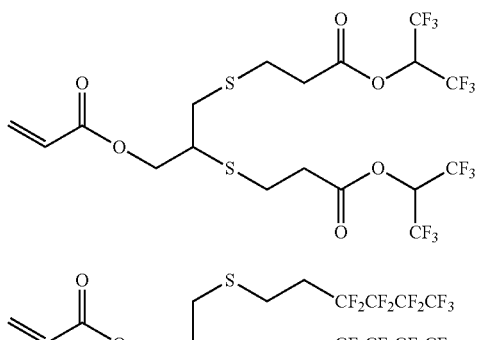
(Ax-6)

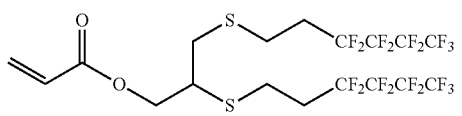
(Ax-7)

(Polymerization Initiating Agent I)

The polymerization initiating agent I is not particularly limited as long as it is activated by the light L1 which is employed when the resist composition 20 is cured and generates active species that initiates polymerization of the polymerizable compounds included in the resist composition 20. Radical polymerization initiating agents are preferred as the polymerization initiating agent I. In addition, a plurality of types of polymerization initiating agents may be employed together as the polymerization initiating agent I in the present invention.

Acylphosphine oxide series compounds and oxime ester series compounds are preferred for utilization as the polymerization initiating agent I, from the viewpoints of curing sensitivity and absorption properties. The compounds described in paragraph [0091] of Japanese Unexamined Patent Publication No. 2008-105414 may be favorably utilized, for example.

The amount of the polymerization initiating agent I to be included in the photocuring composition is within a range from 0.01% to 15% by mass, preferably a range from 0.1% to 12% by mass, and most preferably a range from 0.2% to 7% by mass of the entire composition excluding solvent. In the case that two or more types of polymerization initiating agents I are employed, the combined amount thereof should fall within the above ranges.

If the amount of the photopolymerization initiating agent is 0.01% by mass or greater, sensitivity (curing speed properties), resolution properties, line edge roughness properties, and coated film strength tend to improve, which is preferable. Meanwhile, if the amount of the photopolymerization initiating agent is 15% by mass or less, light transmissive properties, coloration properties, and handling properties tend to improve, which is preferable.

Heretofore, various favorable photopolymerization initiating agents and amounts thereof to be added have been investigated with respect to compositions that include dyes and/or colorants for use in ink jet printers and compositions for use in liquid crystal display color filters. However, there are no reports regarding favorable photopolymerization initiating agents and amounts thereof to be added with respect to photocuring compositions for nanoimprinting. That is, in cases that compositions include dyes and/or colorants, such dyes and colorants may function as radical trapping agents, which may influence photopolymerization properties and sensitivity. The amount of photopolymerization initiating agent to be added for such uses is optimized taking this point into consideration. On the other hand, dyes and/or colorants are not essential components of the resist composition 20. Therefore, there are cases in which the optimal range for the amount of photopolymerization initiating agent to be added will differ from those for compositions to be employed by ink jet printers and for compositions for use in liquid crystal display color filters.

Acylphosphine oxide series compounds and oxime ester series compounds are preferred for utilization as radical photopolymerization initiating agents in the present invention, from the viewpoints of curing sensitivity and absorption properties. Commercially available initiating agents may be employed as the photopolymerization initiating agent. Preferred examples of such commercially available initiating agents are listed in paragraph 0091 of Japanese Unexamined Patent Publication No. 2008-105414.

Note that the light 1 includes radiation, in addition to light having wavelengths in the ultraviolet spectrum, the near ultraviolet spectrum, the far ultraviolet spectrum, the visible spectrum, and the infrared spectrum. The radiation includes microwaves, electron beams, EUV, and X rays, for example. In addition, laser light, such as those emitted by a 248 nm excimer laser, a 193 nm excimer laser, and a 172 nm excimer laser may be employed. These light beams may be monochromatic light beams (single wavelength light beams) which have passed through optical filters, or light beams that include a plurality of different wavelengths (compound light beams) Multiple exposures may be performed. It is also possible to expose the entire surface after the pattern is formed, in order to improve film strength and etching resistance.

It is necessary to select the photopolymerization initiating agent I which is utilized in the present invention according to the wavelength of the light source to be utilized. In addition, it is preferable for the photopolymerization initiating agent I to be that which does not generate gas during mold pressing and exposure. If gas is generated, the mold will be contaminated, and frequent cleansing of the mold will become necessary. In addition, problems, such as the resist composition deforming within the mold, resulting in deterioration of accuracy of transferred patterns, will occur.

It is preferable for the polymerizable monomers included in the resist composition 20 to be radical polymerizable monomers, and for the photopolymerization initiating agent I to be a radical polymerization initiating agent that generates radicals when irradiated with light.

The fluorine containing compound has low adhesive properties with respect to the mold 30, has lubricating properties, and becomes a polymer having a three dimensional structure by being polymerized with the polymerizable compound 21 when cured. Accordingly, the mold release properties of the mold 30 during a separation process after the resist layer 20m is cured are improved, and the mold 30 can be separated with a smaller amount of force. Therefore, deformation of the pattern is suppressed, and more precise patterning becomes possible without administering stringent control during the separation process.

In the case that the fluorine containing polymerizable compound 22 is included in the resist composition 20, it is preferable for the polymerizable compound 21 to be that which does not include fluorine. This is because etching resistance will deteriorate if the amount of fluorine contained in the resist composition 20 is too large. It is preferable for the amount of the fluorine containing polymerizable compound 22 included in the resist composition 20 to be that which results in a thickness of 1.0 nm or less on the surface of the resist layer following pattern formation, more preferably a thickness of 0.7 nm or less, and most preferably a thickness of 0.5 nm or less. In order to yield such thicknesses, it is preferable for the amount of the fluorine containing polymerizable compound 22 in the resist composition 20 to be 5% by mass or less, and more preferably 1% by mass or less. The details of the fluorine containing polymerizable compound 22 will be described later.

(Other Components)

The resist composition 20 of the present invention may include other components, such as surfactants, antioxidant agents, solvents, and polymer components, in addition to the aforementioned polymerizable compound 21, the fluorine containing polymerizable compound 22, and the photopolymerization initiating agent I, within a range that will not take away from the advantageous effects of the present invention. Such additional components will be described hereinbelow.

—Antioxidant Agent—

It is preferable for the resist composition 20 to include a known antioxidant agent. The amount of the antioxidant agent to be included is within a range from 0.01% to 10% by mass with respect to the polymerizable monomers, for example, and preferably a range from 0.2% to 5% by mass with respect to the total amount of the polymerizable compound. In the case that two or more types of antioxidant agents are employed, the combined amount thereof should fall within the above ranges.

The antioxidant agent suppresses color degradation due to heat and light irradiation, as well as color degradation due to various acidic gases such as ozone, activated oxygen, $NO_x$, and $SO_x$ (x is an integer). Particularly in the present invention, addition of the antioxidant agent results in advantages such as coloration of the cured film being prevented, and decreases in film thickness due to decomposition being reduced. Examples of the antioxidant agent include: hydrazides; hindered amine series antioxidant agents; nitrogen containing heterocyclic ring mercapto series compounds; thioether series antioxidant agents; hindered phenol series antioxidant agents, ascorbic acids; zinc sulfate; thiocyanates; thiourea derivatives; sugars; nitrites; thiosulfonates; and hydroxylamine derivatives. Among these, hindered phenol series antioxidant agents and thioether series antioxidant agents are preferred from the viewpoints of coloration of the cured film and decreased film thickness.

Commercially available antioxidant agents include: Irganox 1010, 1035, 1076, and 1222 (by Ciba Geigy, K.K.); Antigene P, 3C, FR, Sumilizer S, and Sumilizer GA80 (by Sumitomo Chemical Industries, K.K.); and ADK STAB A070, A080, and A0503 (by K.K. ADEKA). The antioxidant agents may be used singly or in combination.

—Polymerization Preventing Agent—

It is preferable for the resist composition 20 to include a small amount of a polymerization preventing agent. It is preferable for the amount of the polymerization preventing agent included in the resist composition 20 to be 0.001% to 1% by mass with respect to the total mass of the polymerizable monomers, more preferably within a range from 0.005% to 0.5% by mass, and most preferably within a range from 0.008% to 0.05% by mass. High curing sensitivity can be maintained while suppressing changes in viscosity over time, by incorporating an appropriate amount of the polymerization preventing agent.

—Solvent—

The resist composition 20 may also include various solvents as necessary. It is particularly preferable for the resist composition 20 to include a solvent when forming patterns having film thicknesses of 500 nm or less. Preferred solvents are those having boiling points within a range from 80° C. to 200° C. at atmospheric pressure. Any solvent may be employed as long as it is capable of dissolving the composition. However, preferred solvents are those that include at least one of an ester structure, a ketone structure, hydroxy groups, and an ether structure. Specific examples of such preferred solvents include: propylene glycol monomethyl ether acetate; cyclohexanone; 2-heptanone; gammabutylolactone; propylene glycol Monomethyl ether; and ethyl lactate. These solvents may be employed singly or in combinations as mixtures. Solvents that contain propylene glycol monomethyl ether acetate are most preferred from the viewpoint of coating uniformity.

The amount of the solvent to be included in the resist composition 20 is optimally adjusted according to the viscosity of the components other than the solvent, the coating properties, and the target film thickness. From the viewpoint of coating properties, however, it is preferable for the amount of the solvent to be within a range from 0% to 99% by mass with respect to the composition, and more preferably within a range from 0% to 97% by mass. In the case that a pattern having a film thickness of 500 nm or less is to be formed, it is preferable for the amount of the solvent to be within a range from 20% to 99% by mass, more preferably within a range from 40% to 99% by mass, and most preferably within a range from 70% to 98% by mass.

—Polymer Components—

The resist composition 20 may include polyfunctional oligomers having greater molecular weights than the other polyfunctional polymerizable monomers within a range that enables the objectives of the present invention to be achieved, in order to further increase cross linking density. Examples of polyfunctional oligomers having photoradical polymerization properties are acrylate oligomers, such as: polyester acrylate; urethane acrylate; polyether acrylate; and epoxy acrylate. It is preferable for the amount of oligomer components to be added to be within a range from 0% to 30% by mass with respect to the components of the composition excluding the solvent, more preferably within a range from 0% to 20% by mass, still more preferably within a range from 0% to 10% by mass, and most preferably within a range from 0% to 5% by mass.

The resist composition 20 may further include polymer components, from the viewpoints of improving dry etching resistance, imprinting properties, and curing properties. Polymers having polymerizable functional groups at the side chains thereof are preferred as the polymer components. From the viewpoint of compatibility with the polymerizable compound, it is preferable for the average molecular weight of the polymer components to be within a range from 2000 to 100000, and more preferably within a range from 5000 to 50000.

It is preferable for the amount of the polymer components to be added to be within a range from 0% to 30% by mass with respect to the components of the composition excluding the solvent, more preferably within a range from 0% to 20% by mass, still more preferably within a range from 0% to 10% by mass, and most preferably 2% by mass or less. It is preferable for the amount of polymer components having molecular weights of 2000 or greater to be 30% by mass or less with respect to components of the resist composition 20 excluding the solvent, from the viewpoint of pattern formation properties. In addition, it is preferable for resin components to be minimized from the viewpoint of pattern formation properties. It is preferable for resin components to not be included, excluding surfactants and fine amount of additives.

In addition to the aforementioned components, the resist composition 20 may further include: a mold release agent; a silane coupling agent; an ultraviolet ray absorbing agent; a light stabilizing agent; an aging preventing agent; a plasticizing agent; a close contact promoting agent; a thermal polymerization initiating agent; a coloring agent; elastomer particles; a photooxidation proliferating agent; a photobase generating agent; a basic compound; a fluidity adjusting agent; a defoaming agent; and a dispersing agent as necessary.

The resist composition 20 can be prepared by mixing each of the aforementioned components. In addition, the resist composition 20 can be prepared as a solution, by performing filtering through a filter having a mesh size within a range from 0.003 μm to 5.0 μm after mixing the components. Mixing and dissolving of the photoimprinting curable composition is generally performed within a temperature range from 0° C. to 100° C. The filtering may be performed in a plurality of steps, or repeated a plurality of times. In addition, the filtered liquid may be filtered again. The material of the filter which is utilized in the filtering operation is not particularly limited. Examples of the material of the filter include: polyethylene resin; polypropylene resin; fluorine resin; and nylon resin.

It is preferable for the viscosity of the components of the resist composition 20 excluding the solvent at 25° C. to be within a range from 1 to 100 mPa·s, more preferable within a range from 2 to 50 mPa·s, and most preferably within a range from 5 to 30 mPa·s By setting the viscosity to be within an appropriate range, the rectangular shaping properties of the pattern are improved, and further, the thickness of residual film can be kept low.

Note that the light 1 includes radiation, in addition to light having wavelengths in the ultraviolet spectrum, the near ultraviolet spectrum, the far ultraviolet spectrum, the visible spectrum, and the infrared spectrum. The radiation includes microwaves, electron beams, EUV, and X rays, for example. In addition, laser light, such as those emitted by a 248 nm excimer laser, a 193 nm excimer laser, and a 172 nm excimer laser may be employed. These light beams may be monochromatic light beams (single wavelength light beams) which have passed through optical filters, or light beams that include a plurality of different wavelengths (compound light beams). Multiple exposures may be performed. It is also possible to expose the entire surface after the pattern is formed, in order to improve film strength and etching resistance.

(Resist Coating Step-Second Embodiment)

As described previously, the second embodiment differs from the first embodiment in the method by which the resist composition 20 is arranged on the substrate 10. In the second embodiment, the resist composition 20 is arranged as a plurality of discrete droplets to form the resist layer 20*m* (B of FIG. 2).

The substrate 10 and the surface process administered thereon are the same as those of the first embodiment.

In the present embodiment, it is preferable for the arrangement of the droplets 20 to be adjusted appropriately according to the shape and the density of the protrusions and recesses of the pattern to be formed, the volume of the recesses, and wet spreading properties. By performing such adjustments, it is possible to suppress pattern defects and introduction of air during a subsequent mold pressing step, and also fluctuations in the thickness between the recesses of the resist layer after pattern formation and the substrate (residual film thickness).

It is preferable for an average residual film thickness to be 15 nm or less in order to achieve a quality pattern formed by a subsequent lithography process such as a dry etching process, more preferably 10 nm or less, and most preferably 5 nm or less. It is preferable for the standard deviation (a c value) of the residual film thickness to be 5 nm or less, more preferably 3 nm or less, and most preferably 1 nm or less.

If the residual film is thick, deterioration in the shapes of resist pattern during a step of exposing the surface of the substrate by a dry etching process will increase, and it will become more difficult to obtain a pattern having a desired shape after the etching process.

The method by which the droplets are arranged is not particularly limited as long as the adjustment of the droplet arrangement is possible. Examples of droplet arranging methods include the printing method and the ink jet method. The ink jet method is preferable because adjustments can be executed easily.

The droplet pattern may be designed by performing a test imprinting operation using an experimental test arrangement pattern, then designing the droplet pattern based on the relationship among a wet spread corresponding to a pattern on a mold, a residual film thickness distribution, and the test arrangement pattern. Alternatively, an optimal arrangement pattern may be obtained by calculations based on a predicted anisotropy in the wet spread of resist and a distribution thereof. For example, in the case of a linear pattern, the wetting speed of resist droplets is fast in the direction along the lines due to capillary forces, and the wetting speed is slow in the direction perpendicular to the lines. Therefore, the anisotropy in the wet spread of the resist droplets can be predicted to a certain degree.

It is preferable for the amount of coated droplets 20 to be that which yields a resist layer 20*m* having a thickness within a range from 5 nm to 200 nm after a mold is pressed against the resist layer 20*m*.

The droplets 20 constituted by the resist composition 20 include the polymerizable compound 21 that does not contain fluorine, the fluorine containing polymerizable compound 22 described with reference to the first embodiment, and the polymerization initiating agent I (not shown) which is activated by the light L1.

Taking mold release properties and pattern quality maintenance during a subsequent dry etching process into consideration, it is preferable for the amount of the fluorine containing polymerizable compound 22 included in the droplets 20 to be that which results in a thickness of 1.0 nm or less on the surface of the resist layer following pattern formation, more preferably a thickness of 0.7 nm or less, and most preferably a thickness of 0.5 nm or less. In order to yield such thicknesses, it is preferable for the amount of the fluorine containing polymerizable compound 22 in the droplets 20 to be 5% by mass or less, and more preferably 1% by mass or less.

The polymerization initiating agent I, the light L1, the other components of the resist composition 20 and the viscosity of the resist composition 20 are the same as those described with reference to the first embodiment.

(Pattern Forming Step)

As illustrated in C through D of FIG. 1 and FIG. 2, the mold 30 is pressed against the resist layer 20*m* from the upper surface of the substrate such that the resist composition 20 fills the recesses of the pattern of the mold 30. Thereafter, the light L1 is irradiated to cure the resist layer 20*m*. D of FIG. 1 and FIG. 2 illustrate a case in which the substrate 10 has favorable light transmissive properties with respect to the light L1, and the light L1 is irradiated from the side of the substrate.

The mold 30 is not particularly limited in the case that the substrate 10 has favorable light transmissive properties with respect to the light L1. However, as described previously, it is necessary for the light L1 to be irradiated from the side of the mold 30 in the case that the substrate 10 is not transmissive with respect to the light L1. In such a case, it is necessary for the mold 30 to be transmissive with respect to the light L1.

The advantageous effects of the method for forming patterns of the present invention are more conspicuously exhibited in regions having fine pattern sizes. Particularly advantageous effects can be obtained at regions having a width of 30 nm or less and a pattern aspect ratio of 2 or greater.

The mold 30 may be produced by forming a pattern on the surface of a substrate which is to become the mold by an existing electron beam lithography method, a transfer method using an exposure device, a transfer method using the imprinting method, and combinations of these methods. The surface of the substrate is processed into a pattern by an etching process based on the formed pattern, and a substrate having a desired master pattern thereon is produced as a mold.

It is preferable for pressing of the mold 30 to be executed in a helium atmosphere or a depressurized atmosphere. By adopting this configuration, introduction of air between the mold 30 and the resist resin layer 20m can be suppressed, and generation of unformed pattern regions due to gas components can be avoided.

It is preferable for a patterned surface of the mold 30 to have a mold release process administered thereon, to further improve the mold release properties thereof. A method in which a mold release agent is coated on the patterned surface is a simple mold release process. A fluorine containing resin or a silicon series resin is preferable as the mold release agent. PFPE (PerFluoroPolyEther) or a fluorine containing resin that has a perfluoroalkyl chain are particularly preferable.

The method by which the film of the mold release agent is formed is not particularly limited, and liquid phase methods such as the dip method, the spin method, the spray method, and the immersion method, and gas phase methods such as the vapor deposition method may be employed.

As an alternate mold release process, an inorganic layer that has little interaction with resist may be provided on the surface as a mold release layer. Examples of such inorganic layers include DLC (Diamond Like Carbon) layers and fluorinated DLC layers. Other fluorine containing inorganic layers may also be employed.

Finally, after the resist layer 20m is cured to form the polymer resist layer 40, the temperature of the resist layer 40 is caused to be 40° C. or greater and the mold 30 is released, to form a resist pattern 1 formed by the resist layer 40 on the substrate 10 (E of FIG. 1 and FIG. 2).

The method by which the temperature of the resist layer 40 is controlled is not particularly limited. A mechanism that controls heating at chuck portions of the mold and the substrate, a mechanism that chucks the mold and the substrate within a temperature controlled chamber to release the mold, a mold release device having a radiant temperature control mechanism, or the like may be employed.

As described in the section "Disclosure of the Invention", the resist layer 40 is a thin film having a nano order film thickness. Therefore, it is considered that the temperature of the resist layer 40 is approximately the same as the temperature of the substrate and the temperature of the mold.

As a result of investigation by the present inventors, the advantageous effects of the present invention have been confirmed from the vicinity of 40° C. However, it is preferable for the temperature of the resist layer 40 during mold release to be that set according to the composition and physical properties of the resist layer 40 which enables smooth execution of mold release with favorable pattern precision and little adhered matter on the mold 30.

The temperature of the substrate is preferably within a range from 40° C. to 100° C. in view of concerns regarding pattern shift during a close contact state due to differences in thermal contraction between the substrate and the mold and deformation of the resist due to heat, more preferably within a range from 40° C. to 80° C., and most preferably within a range from 40° C. to 70° C. If the temperature exceeds 120° C., significant shifting due to thermal expansion of the substrate will occur. For example, such shifting will be particularly significant at the outer peripheral portion of a concentric hard disk pattern, and there is a possibility that defects due to pattern shifts will occur. In addition, if the temperature during mold release is excessively high, significant deterioration of the mold release layer of the mold during mold release will occur, resulting in shortening of the life of the mold. This will reduce productivity when repeatedly utilizing a single mold, and also reduce productivity because the burden of temperature control will be increased.

As described previously, the present inventors have formed the resist layer 40 as a cross linked polymer having a three dimensional structure. Thereby, the temperature of the resist layer 40 during mold release can be adjusted to that which imparts deformation properties such that the resist layer 40 has a sufficient elastic deformable range, enabling the mold 30 to be released smoothly while maintaining high pattern precision and suppressing adhesion of the resist layer 40 on the mold 30. Accordingly, the present invention does not require stringent control of mold release conditions other than that of the temperature of the resist layer. In addition, it is not necessary to stringently control the temperature during mold release as long as the temperature is within an appropriate mold release temperature range.

Release of the mold 30 may be executed from the peripheral areas thereof, or gradually from one side thereof. In addition, the mold release step may incorporate a method that releases the mold while applying pressure from the side of the mold to reduce the amount of force which is applied to the resist layer at the borderline at which the mold is separated from the resist layer (pressurized release method).

The direction in which the mold is separated may be selected as appropriate from those which are known. However, it is preferable for the mold to be gradually separated starting from the peripheral areas thereof, in order to disperse external forces which are applied to the pattern during mold release such that pattern defects are suppressed.

[Method for Producing Patterned Substrate]

The resist layer 40 which is formed as a pattern on the substrate 10 by the methods described above may be employed as a mask when patterning the substrate 10 with a lithography method. In the present invention, the resist pattern 1 on the substrate 10 is employed as a mask to process the surface 10S of the substrate 10 into a pattern of protrusions and recesses, as illustrated in F of FIG. 1 and FIG. 2.

The method by which the substrate 10 is processed is not particularly limited, but it is preferable for a method that can process the surface 10S of the substrate in a direction substantially perpendicular to the surface 10S with high pattern precision. Preferred examples of such processing methods include the dry etching method and the ion milling method.

When recesses having a desired depth are formed on the surface 10S of the substrate (G of FIG. 1 and FIG. 2), the resist layer 40 remaining on the surface 10S is removed, and a patterned substrate 2 is obtained (H of FIG. 1 and FIG. 2). The method by which the resist layer 40 is removed is not particularly limited, and anisotropic etching by oxygen plasma or the like may be employed.

The method for forming patterns of the present invention is an optical imprinting method that employs the polymerizable compound including the polymerizable compound 21 that includes polyfunctional monomers that become cross linked to form three dimensional structures when polymerized and the polymerization initiating agent I which is activated by light (L1), and separates the mold 30 from the resist layer 20m under conditions that the temperature of the resist layer 20m is 40° C. or greater. In this method, the mold is separated while the cured resist layer 40 is in an elastically deformable state with favorable brittleness by heating the cured resist layer 40. Therefore, the occurrence of pattern formation failures can be suppressed. In addition, because the cured resist composition is a polymer having a three dimensional structure, the deformation due to heating is not plastic deformation. Accordingly, pattern precision following mold release is favorably maintained.

In the method for forming patterns of the present invention, the fluorine content of the resist composition 20 can be low. Therefore, the viscosity of the resist composition 20 and the etching resistance of the resist material after curing can be favorably maintained. In addition, it is not necessary to provide a surfactant at the interface between the resist layer 20m and the mold, and therefore pattern formation failures and deterioration of the mold due to contamination thereof can be prevented.

Accordingly, the present invention enables highly precise patterning even in nano order pattern formation, having superior productivity and etching resistance.

In addition, a highly precisely patterned substrate 2 can be produced by processing the substrate 10 with a lithography method, using the resist pattern 1 made by the method for forming patterns of the present invention as a mask.

EXAMPLES

Examples of the present invention and Comparative Examples will be described.

Example 1

A Si substrate was prepared, and a surface to be processed was cleaned with a UV cleaner (processed for 1 minute). Then, an interfacial bonding agent was formed as a film having a thickness of 0.1 nm on the surface to be processed by using the spin coat method to coat the surface with a surface processing liquid, in which 0.1 g of a silane coupling agent 3-acryloxypropyl trimethoxysilane (KBM-5103 by Shin-Etsu Chemical K.K.) and 10 g of an organic solvent propylene glycol monomethyl ether acetate (PGMEA) were mixed. Further, an annealing process was performed for five minutes at a temperature of 120° C.

Next, a resist composition R1 having the composition shown below was prepared. Then the resist composition was coated on the processed surface of the Si substrate by the spin coat method such that the thickness thereof after baking was 40 nm. Further, baking (for 1 minute at 60° C.) was performed to form a resist layer on the substrate.

<<Resist Composition R1>>—Aromatic Polyfunctional Monomers—
  Polymerizable Compound (20 g each of naphthyl methyl acrylate and 1,4-diacryloyloxy methyl benzene)
  Fluorine Containing Polymerizable Compound (1.0 g of Ax-4)
  Photopolymerization Initiating Agent (0.8 g of ethyl-2,4, 6-triethylbenzoin phenylphosphinate (Irgacure 379 by BASF))
  Organic Solvent (959.0 g of PGMEA: 4% solid concentration)
<Imprinting Step>

A quartz mold having a pattern of concentric stripes arranged at a pitch of 75 nm as protrusions and recesses (45 nm wide protrusions, 60 nm deep recesses, and 83° taper angle in a radial range from 13 mm to 32 mm) formed on a 2.5 inch disk was prepared. A mold release process was administered using Optool DSX (by Daikin Industries), which is a fluorine series contamination preventing coating agent.

The surface having the protrusions and recesses of the mold was pressed against the SI substrate on which the resist layer is formed within a helium atmosphere inside a chamber. Then, pressure was applied across the entire surface of the mold under conditions of 10 atmospheric pressures and room temperature for 60 seconds, to transfer the pattern of protrusions and recesses of the mold onto the resist layer. In this state, UV rays (wavelength: 365 nm) were irradiated at 300 mJ/cm$^2$ from the side of the mold to cure the resist to solidify the patterned shape.

Next, the back surface of the substrate was fixed to a suctioning chuck having a heating mechanism and the substrate was heated to 50° C. The mold was separated from the resist layer from the outer peripheral edge portion of the surface thereof in close contact with the resist layer over 1 second in a state in which the temperature of the substrate was maintained at 50° C., to produce a patterned body with a resist layer having the pattern of protrusions and recesses transferred thereto.

<Substrate Processing Step>

The substrate of the patterned body was cooled to 10° C. from the back surface thereof. Then, dry etching was performed on the patterned body having the resist layer with the pattern of protrusions and recesses transferred thereto, using the imprinted patterned resist layer as a mask by the argon ion milling method (with ICP etching apparatus NE-550 by ULVAC), to form protrusions and recesses on the substrate, based on the pattern of protrusions and recesses formed on the resist layer.

<Resist Layer Removing Step>

Thereafter, an oxygen ashing process was administered on the surface of the patterned body having the protrusions and recesses formed thereon, and a UV process was further administered, to remove the resist layer that remained after the substrate processing step.

Examples 2 and 3

Mask patterns were formed and substrates were processed in the same manner as in Example 1, except that the temperature of the substrate during mold release was set to 80° C. and 110° C., respectively.

Example 4

A mask pattern was formed and a substrate was processed in the same manner as in Example 1, except that the amount of the fluorine containing polymerizable compound (Ax-4) in the resist composition R1 was 1/10 that of Example 1.

Comparative Example 1

A mask pattern was formed and a substrate was processed in the same manner as in Example 1, except that the temperature of the substrate during mold release was set to 150° C.

Comparative Example 2

A mask pattern was formed and a substrate was processed in the same manner as in Example 1, except that the substrate was not heated during mold release (the temperature of the substrate was 25° C.)

Comparative Example 3

A mask pattern was formed and a substrate was processed in the same manner as in Comparative Example 2, except that the amount of the coated resist composition was 5 times that of Comparative Example 2.

Example 8

A mask pattern was formed and a substrate was processed in the same manner as in Example 1, except that 2,2,3,3,4,4,5,5-octafluoro 1,6-hexylacrylate (by SynQuest Laboratories, Inc.) was employed as a fluorine containing polymerizable compound C.

Examples 9 and 10

Mask patterns were formed and substrates were processed in the same manner as in Example 8, except that the temperature of the substrate during mold release was set to 80° C. and 110° C., respectively.

Comparative Example 5

A mask pattern was formed and a substrate was processed in the same manner as in Example 8, except that the temperature of the substrate during mold release was set to 150° C.

Example 11

A mask pattern was formed and a substrate was processed in the same manner as in Example 1, except that the following compound R2 was employed.
<<Resist Composition R2>>—Aliphatic Polyfunctional Monomers—
  Polymerizable Compound (20 g each of Aronix M220 and Aronix M310)
  Fluorine Containing Polymerizable Compound (1.0 g of Ax-4)
  Photopolymerization Initiating Agent (0.8 g of ethyl-2,4,6-triethylbenzoinphenylphosphinate (Irgacure 379 by BASF))
  Organic Solvent (959.0 g of PGMEA: 4% solid concentration)

Examples 12 and 13

Mask patterns were formed and substrates were processed in the same manner as in Example 11, except that the temperature of the substrate during mold release was set to 80° C. and 110° C., respectively.

Example 14

A mask pattern was formed and a substrate was processed in the same manner as in Example 11, except that the amount of the fluorine containing polymerizable compound (Ax-4) in the resist composition R2 was 1/10 that of Example 11.

Example 15

A mask pattern was formed and a substrate was processed in the same manner as in Example 11, except that fluorine containing polymerizable compound (Ax-4) was not included in the resist composition R2.

Comparative Example 6

A mask pattern was formed and a substrate was processed in the same manner as in Example 11, except that the temperature of the substrate during mold release was set to 150° C.

Comparative Example 7

A mask pattern was formed and a substrate was processed in the same manner as in Example 11, except that the substrate was not heated during mold release (the temperature of the substrate was 25° C.)

Comparative Example 8

A mask pattern was formed and a substrate was processed in the same manner as in Comparative Example 7, except that the amount of the coated resist composition was 5 times that of Comparative Example 7.

Comparative Examples 9

Mask patterns were formed and substrates were processed in the same manner as in Examples 11, except that a non polymerizable fluorine containing compound was employed.

Comparative Example 10

A mask pattern was formed and a substrate was processed in the same manner as in Example 12, except that a non polymerizable fluorine containing compound was employed as a surfactant.

Comparative Example 11

A mask pattern was formed and a substrate was processed in the same manner as in Example 13, except that a non polymerizable fluorine containing compound was employed as a surfactant.

Comparative Example 12

A mask pattern was formed and a substrate was processed in the same manner as in Example 1, except that the following compound R2 was employed.
<<Resist Composition R3>>
  Polymerizable Compound (32 g of nonylphenyl ethylene oxide denatured acrylate (Aronix M113 by To a Gosei) and 8 g of Aronix M310 by To a Gosei)
  Fluorine Containing Polymerizable Compound (1.0 g of Ax-4)
  Photopolymerization Initiating Agent (0.8 g of ethyl-2,4,6-triethylbenzoinphenylphosphinate (Irgacure 379 by BASF))
  Organic Solvent (959.0 g of PGMEA: 4% solid concentration)

Comparative Examples 13 and 14

Mask patterns were formed and substrates were processed in the same manner as in Comparative Example 12, except that the temperature of the substrate during mold release was set to 80° C. and 110° C., respectively.
<Evaluations>
The quality of the shapes and positions of resist patterns, residual film thickness, deterioration in pattern formation properties after repetitive (50) imprinting operations, and the quality and shapes during processing of substrates were evaluated as described below. The results of the evaluations are indicated in Table 1.

<<Shapes of Resist Patterns and Residual Film Thicknesses>>

Height: The pattern heights were compared against the depth of the mold and used as indices to evaluate pattern formability.

Cases in which the differences in the heights of protrusions (the depths of recesses) with those of the mold were less than ±5% were evaluated as GOOD.

Cases in which the differences in the heights of protrusions (the depths of recesses) with those of the mold were within a range from ±5% to ±10% were evaluated as FAIR.

Cases in which the differences in the heights of protrusions (the depths of recesses) with those of the mold were greater than ±10% were evaluated as POOR.

Peeling: The degrees of peeling were used as indices for evaluating mold release properties.

Cases in which pattern defects such as peeling and broken lines were 1% or less were evaluated as GOOD.

Cases in which pattern defects such as peeling and broken lines were greater than 1% were evaluated as POOR.

Pattern Position Shift: Evaluations were performed by confirming whether positional shifting of patterns had occurred with an optical microscope.

Cases in which locations at which positional shifting had occurred were not present were evaluated as GOOD.

Cases in which locations at which positional shifting had occurred were present were evaluated as POOR.

Accuracy of Shapes: Distortions of patterns were evaluated using the following indices with respect to the cross sectional shapes (rectangular properties) of line portions observed with an SEM.

Cases in which differences between taper angles at the left and right of the cross section of the patterns were 2° or less were evaluated as GOOD.

Cases in which differences between taper angles at the left and right of the cross section of the patterns were within a range from 2° to 5° were evaluated as FAIR.

Cases in which differences between taper angles at the left and right of the cross section of the patterns were greater than 5° were evaluated as POOR.

Pattern Line Width: The widths of the line shaped protrusions observed by an SEM were evaluated using the widths of the recesses of the mold as a reference.

Cases in which differences in the widths were less than ±5% were evaluated as GOOD.

Cases in which differences in the widths were within a range from ±5% to ±10% were evaluated as FAIR.

Cases in which differences in the widths were greater than ±10% were evaluated as POOR.

<<Shapes and Quality when Substrates are Processed>>

Processing Characteristics of Substrates During RIE Dry Etching:

Cases in which differences between the heights of protrusions and target heights were less than ±5% and the roughness of the substrate was equal to or less than the roughness of the mold were evaluated as GOOD.

Cases in which differences between the heights of protrusions and target heights were within a range from ±5% to ±10% or the roughness of the substrate was greater than the roughness of the mold but less than 1 nm were evaluated as FAIR.

Cases in which differences between the heights of protrusions and target heights were greater than ±10% or the roughness of the substrate was greater than the roughness of the mold by mm or more were evaluated as POOR.

Deterioration of Properties Following (50) Repeated Pattern Formation Operations Pattern samples were evaluated after a 51st imprinting operation after 50 imprinting operations were executed, using the same indices as those employed to evaluate the imprinted pattern heights. In addition, the shapes of the patterns of RIE processed samples which were processed by RIE using the imprinted pattern samples were evaluated using the same indices as those employed to evaluate the processing characteristics of the substrates.

As illustrated in Table 1, the Examples that employed the method for forming patterns and the method for producing patterned substrates of the present invention exhibited favorable qualities (heights, peeling, position shifts, and accuracy of shapes) in the shapes of mask patterns, and the pattern formation precision by etching was also favorable.

In contrast, the quality of the mask patterns was poor in the Comparative Examples, or even if the quality of the mask patterns were favorable, there were problems related to etching resistance, resulting in highly precise processing of substrates being precluded. These results confirm the advantageous effects of the present invention.

TABLE 1

| | Resist | | | | | | | | | | | | |
|---|---|---|---|---|---|---|---|---|---|---|---|---|---|
| | | | Fluorine Containing Compound Layer Thickness | Film Forming Method | | | | | | | Substrate Pattern | | Following Repetition |
| | Main Component | Fluorine Containing Compound | | Mold Release Temperature (° C.) | Resist Layer Thickness (nm) | Imprinting Properties | | | | | | | |
| | | | (nm) | | | Height | Peeling | Position Shifts | Accuracy of Shapes | Line Width | Accuracy of Shapes | Mask Pattern | Substrate |
| Example 1 | R1 | Polymer A | 1 | 50 | 10 | GOOD | GOOD | GOOD | GOOD | GOOD | GOOD | GOOD | GOOD |
| Example 2 | | | 1 | 50 | 10 | GOOD | GOOD | GOOD | GOOD | GOOD | GOOD | GOOD | GOOD |
| Example 3 | | | 1 | 110 | 10 | GOOD | GOOD | GOOD | GOOD | GOOD | GOOD | GOOD | GOOD |
| Example 4 | | | 0.1 | 50 | 10 | GOOD | GOOD | GOOD | GOOD | GOOD | GOOD | GOOD | GOOD |
| Comparative Example 1 | | | 1 | 150 | 10 | GOOD | GOOD | POOR | GOOD | GOOD | GOOD | GOOD | GOOD |

TABLE 1-continued

| | Resist | | Film Forming Method | | Imprinting Properties | | | | Substrate Pattern | | Following Repetition | |
|---|---|---|---|---|---|---|---|---|---|---|---|---|
| | | Fluorine Containing Compound | Mold Release Layer Thickness (nm) | Resist Layer Thickness (nm) | | | | | | | | |
| Main Component | Fluorine Containing Compound | Compound Layer Thickness (nm) | Temperature (°C.) | | Height | Peeling | Position Shifts | Accuracy of Shapes | Line Width | Accuracy of Shapes | Mask Pattern | Substrate |
| Comparative Example 2 | | | 1 | 25 | 10 | GOOD | POOR | GOOD | FAIR | GOOD | POOR | GOOD | GOOD |
| Comparative Example 3 | | | 1 | 25 | 50 | GOOD | GOOD | GOOD | GOOD | POOR | POOR | GOOD | GOOD |
| Example 8 | R1 | Polymer C | 1 | 50 | 10 | GOOD | FAIR | GOOD | GOOD | GOOD | GOOD | GOOD | GOOD |
| Example 9 | | | 1 | 50 | 10 | GOOD | GOOD | GOOD | GOOD | GOOD | GOOD | GOOD | GOOD |
| Example 10 | | | 1 | 110 | 10 | GOOD | GOOD | GOOD | GOOD | GOOD | GOOD | GOOD | GOOD |
| Comparative Example 5 | | | 1 | 150 | 10 | GOOD | GOOD | POOR | FAIR | GOOD | POOR | GOOD | GOOD |
| Example 11 | R2 | Polymer A | 1 | 50 | 10 | GOOD | GOOD | GOOD | GOOD | FAIR | FAIR | GOOD | FAIR |
| Example 12 | | | 1 | 50 | 10 | GOOD | GOOD | GOOD | GOOD | FAIR | FAIR | GOOD | FAIR |
| Example 13 | | | 1 | 110 | 10 | GOOD | GOOD | GOOD | GOOD | FAIR | FAIR | GOOD | FAIR |
| Example 14 | | | 0.1 | 50 | 10 | GOOD | GOOD | GOOD | GOOD | FAIR | FAIR | GOOD | FAIR |
| Example 15 | | | 0 (n/a) | 50 | 10 | GOOD | GOOD | GOOD | GOOD | FAIR | FAIR | FAIR | FAIR |
| Comparative Example 6 | | | 1 | 150 | 10 | GOOD | GOOD | POOR | FAIR | FAIR | FAIR | GOOD | FAIR |
| Comparative Example 7 | | | 1 | 25 | 10 | GOOD | POOR | GOOD | GOOD | FAIR | POOR | FAIR | POOR |
| Comparative Example 8 | | | 1 | 25 | 50 | GOOD | GOOD | GOOD | GOOD | POOR | POOR | GOOD | POOR |
| Comparative Example 9 | R2 | Not Polymerizable | 1 | 50 | 10 | GOOD | GOOD | GOOD | GOOD | FAIR | FAIR | POOR | POOR |
| Comparative Example 10 | | | 1 | 50 | 10 | GOOD | GOOD | GOOD | GOOD | FAIR | FAIR | POOR | POOR |
| Comparative Example 11 | | | 1 | 110 | 10 | GOOD | GOOD | GOOD | GOOD | FAIR | FAIR | POOR | POOR |
| Comparative Example 12 | R3 | Polymer A | 1 | 50 | 10 | GOOD | POOR | GOOD | POOR | FAIR | POOR | GOOD | GOOD |
| Comparative Example 13 | | | 1 | 50 | 10 | GOOD | GOOD | GOOD | POOR | FAIR | POOR | GOOD | GOOD |
| Comparative Example 14 | | | 1 | 110 | 50 | GOOD | GOOD | GOOD | POOR | FAIR | POOR | GOOD | GOOD |

[Field of Industrial Applicability]

The present invention may be favorably applied to patterning of patterned media and patterning of substrates for semiconductor elements.

What is claimed is:

1. A method for forming a pattern, comprising:
   forming a resist layer constituted by a resist composition which may include unavoidable impurities including a polymerizable compound that includes polyfunctional monomers that become polymers having three dimensional structures by cross linking when polymerized and a polymerization initiating agent which is activated by one of light and an electron beam on a substrate;
   pressing a surface of a mold having a predetermined pattern of protrusions and recesses against the resist layer:
   irradiating the light or the electron beam onto the resist layer to cure the resist layer; and
   separating the mold from the resist layer under conditions that the temperature of the resist layer is 40° C. or greater.

2. A method for forming a pattern as defined in claim 1, wherein
   the mold is separated from the resist layer by causing the temperature of one of the substrate and the mold to be 40° C. or greater.

3. A method for forming a pattern as defined in claim 1, wherein
   the mold is separated from the resist layer under conditions that the temperature of the resist layer is 50° C. or greater.

4. A method for forming a pattern as defined in claim 1, wherein
   the mold is separated from the resist layer under conditions that the temperature of the resist layer is 120° C. or less.

5. A method for forming a pattern as defined in claim 1, wherein:
   the resist composition further includes a fluorine containing polymerizable compound.

6. A method for forming a pattern as defined in claim 5, wherein:
   the fluorine containing polymerizable compound is included in the resist composition at 5% by mass or less.

7. A method for forming a pattern as defined in claim 5, wherein:
   a fluorine containing polymerizable compound having monomers with a plurality of fluorine containing groups, which are at least one type of fluorine containing group selected from fluoroalkyl groups and fluoroalkyl ether groups, and at least two of the plurality of fluorine containing groups being separated by linking groups having a carbon number of 2 or greater, is employed as the fluorine containing polymerizable compound.

8. A method for forming a pattern as defined in claim 7, wherein:
at least two of the fluorine containing groups are fluoroalkyl groups having a carbon number of 2 or greater.

9. A method for forming a pattern as defined in claim 1, wherein:
the polymerizable compound that includes the polyfunctional monomers includes at least one type of polymerizable monomer represented by General Formula (1) below:

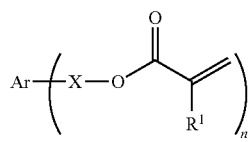

General Formula (1)

wherein Ar represents a bivalent or trivalent aromatic group that may have a substituent group, X represents a single bond or an organic linking group, $R^1$ represents a hydrogen atom or an alkyl group that may have a substituent group and n represents either 2 or 3.

10. A method for forming a pattern as defined in claim 9, wherein:
the polymerizable compound including the polyfunctional monomers is in liquid form at 25° C.

11. A method for forming a pattern as defined in claim 9, wherein:
the polymerizable compound including the polyfunctional monomers includes a monofunctional monomer having at least one of an aromatic ring structure or an alicyclic hydrocarbon structure.

12. A method for forming a pattern as defined in claim 1, wherein:
the polymerizable compound that includes polyfunctional monomers does not contain fluorine.

13. A method for forming a pattern as defined in claim 1, wherein:
the surface of the substrate on which the resist layer is formed is coated with an interfacial bonding agent that cross links the surface and the resist layer, prior to forming the resist layer on the substrate.

14. A method for producing patterned substrates, comprising:
forming a resist layer on a substrate by the method for forming a pattern as defined in claim 1; and
forming a pattern of protrusions and recesses based on the pattern of the resist layer on the substrate, by executing a lithography method using the resist layer as a mask.

* * * * *